United States Patent
Thiel

(10) Patent No.: US 10,481,211 B2
(45) Date of Patent: Nov. 19, 2019

(54) STATE-OF-CHARGE INDICATOR

(71) Applicant: LAT Enterprises, Inc., Raleigh, NC (US)

(72) Inventor: Laura Thiel, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 0 days.

(21) Appl. No.: 15/612,617

(22) Filed: Jun. 2, 2017

(65) Prior Publication Data

US 2017/0269162 A1  Sep. 21, 2017

Related U.S. Application Data

(63) Continuation-in-part of application No. 14/156,126, filed on Jan. 15, 2014, now abandoned.

(51) Int. Cl.
| | |
|---|---|
| *G01R 31/36* | (2019.01) |
| *G08B 21/00* | (2006.01) |
| *H02J 7/00* | (2006.01) |
| *G01R 31/3835* | (2019.01) |
| *G01R 31/371* | (2019.01) |
| *H01M 10/48* | (2006.01) |
| *H01M 10/42* | (2006.01) |
| *G01R 31/388* | (2019.01) |

(52) U.S. Cl.
CPC ........ *G01R 31/3835* (2019.01); *G01R 31/371* (2019.01); *G01R 31/3646* (2019.01); *G01R 31/388* (2019.01); *H01M 10/482* (2013.01); *H01M 10/488* (2013.01); *H01M 2010/4278* (2013.01)

(58) Field of Classification Search
CPC .................. G01R 31/362; G01R 31/3682
See application file for complete search history.

(56) References Cited

U.S. PATENT DOCUMENTS

| | | | |
|---|---|---|---|
| 4,413,221 A | 11/1983 | Benjamin et al. | |
| 4,711,248 A | 12/1987 | Steuer et al. | |
| 5,083,076 A | 1/1992 | Scott | |
| 5,474,599 A * | 12/1995 | Cheney | B03C 3/155 95/63 |
| 5,700,089 A * | 12/1997 | McKinnon | G01R 31/382 374/142 |
| 7,932,805 B2 * | 4/2011 | Darr | H01H 85/30 116/206 |

(Continued)

FOREIGN PATENT DOCUMENTS

CN  103777145 A * 5/2014 ......... G01R 31/3624

*Primary Examiner* — Christopher P McAndrew
*Assistant Examiner* — Zannatul Ferdous
(74) *Attorney, Agent, or Firm* — NEO IP

(57) ABSTRACT

A pluggable state-of-charge (SOC) indicator and methods of use are disclosed. The pluggable SOC indicator includes at least one voltage input jack for connecting to a battery, at least one instance of control electronics, and at least one SOC indicator, such as a 5-bar liquid crystal display (LCD). Embodiments of the pluggable SOC indicator include, but are not limited to, a pluggable single-connector SOC indicator, a pluggable dual-connector SOC indicator, and a pluggable quad-connector SOC indicator. Further, the control electronics are programmable for any input voltage range and/or battery discharge characteristics.

20 Claims, 23 Drawing Sheets

(56) References Cited

U.S. PATENT DOCUMENTS

| | | | |
|---|---|---|---|
| 2004/0257042 A1* | 12/2004 | Liu | H01M 10/441 320/130 |
| 2005/0009126 A1* | 1/2005 | Andrews | C12Q 1/54 435/14 |
| 2006/0017582 A1 | 1/2006 | Lockhart et al. | |
| 2006/0079108 A1* | 4/2006 | McCoy | H01R 24/20 439/284 |
| 2009/0130541 A1* | 5/2009 | Emori | H02J 7/0019 429/61 |
| 2010/0009724 A1* | 1/2010 | Fischer | H02J 1/10 455/573 |
| 2012/0105009 A1 | 5/2012 | Yao | |
| 2012/0161846 A1* | 6/2012 | Ningrat | G06F 3/0416 327/365 |
| 2014/0077819 A1* | 3/2014 | Stark | G01R 31/3696 324/434 |
| 2014/0218200 A1 | 8/2014 | Chen | |
| 2015/0171650 A1* | 6/2015 | Wong | H02J 7/0047 320/148 |
| 2015/0369873 A1* | 12/2015 | Nakao | G01R 31/3606 702/63 |

* cited by examiner

| Bars | Status | 16.8V Li ion rechargeable battery | | | 29.4V Li ion rechargeable battery | | |
|---|---|---|---|---|---|---|---|
| | | Maximum Voltage | Minimum Voltage | 0-5V* | Maximum Voltage | Minimum Voltage | 0-5V* |
| 5 | Flash | | 16.8 | 4.18 | | 29.4 | 4.18 |
| 4 | Steady | 16.8 | 16.2 | 4.02 | 29.4 | 28.3 | 4.02 |
| 3 | Steady | 16.2 | 15.5 | 3.835 | 28.3 | 27 | 3.835 |
| 2 | Steady | 15.5 | 14.5 | 3.605 | 27 | 25.4 | 3.605 |
| 1 | Steady | 14.5 | 13.7 | 3.404 | 25.4 | 24 | 3.404 |
| | Steady | 13.7 | 13.2 | 3.28 | 24 | 23 | 3.28 |
| | Flash | 13.2 | 10.5 | 2.61 | 23 | 18.4 | 2.61 |
| 0 | | 10.5 | 0 | 0 | 18.4 | 0 | 0 |

FIG. 22

STATE-OF-CHARGE INDICATOR

CROSS REFERENCE TO RELATED APPLICATIONS

This application is related to and claims priority from the following US patent applications: this application is a continuation-in-part of U.S. application Ser. No. 14/156,126, filed Jan. 15, 2014, which is incorporated herein by reference in its entirety.

BACKGROUND OF THE INVENTION

1. Field of the Invention

The present invention relates to state-of-charge (SOC) indicators for batteries, and more specifically to pluggable state-of-charge indicators and methods of use thereof.

2. Description of the Prior Art

It is generally known in the prior art to provide indicators for monitoring the state-of-charge (SOC) of rechargeable batteries, such as lithium ion batteries. SOC indicators often are incorporated into the battery housing itself. Soldiers often carry 27.2-45.4 kg(60-100 lbs) of gear, including equipment (e.g., radios) in their rucksack or attached to their vest that operate on rechargeable batteries. As the rechargeable batteries are often inside a rucksack behind the soldier, it would not be practical to have a SOC indicator on the battery housing because the soldier would have to take the rucksack off, open the rucksack, and then check the SOC of the battery. Additionally, a built-in SOC indicator acts as a load, operating continuously and constantly draining the battery that it is monitoring. This reduces the shelf life of the battery and increases maintenance required to make sure the battery has a charge.

Examples of relevant prior art documents include the following:

U.S. Pat. No. 4,413,221 for method and circuit for determining battery capacity by inventors Benjamin et al., filed Dec. 18, 1980 and issued Nov. 1, 1983, is directed to determining the capacity of a battery while charging the battery by measuring the time it takes the battery voltage to decrease to a selected voltage level during discharging intervals interspersed between charging intervals. The state-of-charge is also determined by measuring the voltage level during a discharge interval while monitoring the duration of the charge cycle. Additionally, faulty cells of the battery are detected by measuring the voltage of the individual cells at the end of a discharging interval during the charging of the battery.

U.S. Pat. No. 4,711,248 for physiological pressure monitor by inventors Steuer et al., filed Dec. 1, 1983 and issued Dec. 8, 1987, is directed to a portable physiological pressure monitoring device adapted for being attached to a body part of a patient in which the compartment pressure is to be continuously monitored. The device includes an alarm for indicating when a predetermined maximum pressure limit is exceeded or when a predetermined minimum pressure is not maintained for a certain period of time. The pressure device also includes a hydrophobic filter which separates a catheter and the sensing components of the pressure device for providing sterile operation. A warning also sounds when a battery falls below a given voltage level. Finally, the pressure monitoring device also includes apparatus for measuring nerve conduction velocity and action potential to facilitate better diagnosis and monitoring of compartment syndrome.

U.S. Pat. No. 4,949,046 for battery state of charge indicator by inventor Seyfang, filed Jun. 21, 1998 and issued Aug. 14, 1990, is directed to a device for indicating changes in the state of charge of a rechargeable battery including a current sensor to sense current flow into and out of the battery and to provide an output indicative of both the magnitude and direction of the current flow, a timer to provide a timing signal, and a computer programmed to compute from the output of the current sensor and the timer, a signal representative of the charge dissipated from or accumulated in the battery over a period of time. Preferably the device includes data storage to store an indication of the state of charge of the battery and the computer is programmed to use the signal to update the stored data to provide an indication of the current state of charge of the battery.

U.S. Pat. No. 5,083,076 for portable battery booster by inventor Scott, filed Nov. 13, 1989 and issued Jan. 21, 1992, is directed to a wheeled cabinet that contains two internal booster batteries. Jumper cables are connectible to the booster batteries by a plug-and-socket connector. With the plug disconnected from the socket, end clamps of the jumper cables are applied across a battery or batteries of a vehicle to be jump started. Display lamps are actuated to indicate whether or not the polarity of the jumper cables as connected to the vehicle battery or batteries is correct and whether or not the connection points are appropriate for the potential (12 volt or 24 volt) which should be applied. When it is determined that the connection of the jumper cables to the vehicle batteries is correct, the plug is inserted into the socket to connect the booster batteries to the vehicle battery or batteries and permit jump-starting of the vehicle.

U.S. Pat. No. 5,477,129 for charge level display method and apparatus for a battery of an electronic device by inventor Myslinski, filed Nov. 22, 1993 and issued Dec. 19, 1995, is directed to a portable computer is positionable between an open condition in which an input device and an output device thereof is exposed to a user of the portable computer, and a closed condition in which the input device and the output device is protectively stowed within the portable computer, and further with the portable computer having an "on" state of operation and an "off" state of operation. The portable computer includes a battery, and a display for indicating charge levels of the battery, wherein the display is visible to the user in the open condition and in the closed condition. The portable computer further includes a mechanism for operating the display when the portable computer is in the "on" state of operation and in the "off" state of operation. Moreover, the display is operated to continuously indicate charge levels during the entire "on" state of operation as well as during the entire "off" state of operation.

U.S. Pat. No. 5,705,929 for battery capacity monitoring system by inventors Caravello et al., filed May 23, 1995 and issued Jan. 6, 1998, is directed to a method of and apparatus for centrally monitoring the capacity of batteries in a battery string includes electrical leads connected to each battery terminal of the battery string. A capacity testing system a) switches between the electrical leads for sequentially selecting the leads associated with the terminals of each battery, b) measures the internal resistance of the battery associated with each selected pair of electrical leads, c) compares the internal resistance of each battery cell to an internal resistance threshold, and d) triggers an alarm when the internal resistance of a battery exceeds the internal resistance threshold. A central monitoring station monitors battery capacity data and alarm signals from various battery strings, schedules battery capacity testing, transmits control commands to each capacity testing system for i) scheduling testing, ii) initializing upload of capacity data, and iii) requesting status information, provides battery capacity data analysis, and uploads information to a network management computer. The system is especially suitable for centrally monitoring the capacity of batteries located remote from the central station, preferably in external telecommunications housings and telecommunications power rooms.

U.S. Pat. No. 5,898,290 for battery pack with capacity and pre-removal indicators by inventors Beard et al., filed Sep. 6, 1996 and issued Apr. 27, 1999, is directed to a battery capacity monitoring system readily indicates the remaining capacity of an uninserted battery pack upon an operator's request. Such request may involve the touching of one or more contacts disposed on the battery pack. The battery pack also includes a display and a communication means for communicating capacity information to the device in which it may be installed. The communication means may also be used to display status when the battery pack is not inserted. When inserted a device, the battery pack and device participate to determine time estimates for remaining battery life based on known device loading characteristics and current battery capacity. An operator viewing such information may more adequately determine the usage value of the current battery charge. Moreover, the battery pack and corresponding device are configured to detect the beginning of the process of removing a battery pack. In response, the device saves operational states and data before losing power. Such stored information may be restored upon insertion of another battery pack into the device, permitting the operator to continue where they left off.

US Publication No. 20040189256 for reusable state of charge indicator by inventor Sink, filed Feb. 12, 2004 and published Sep. 30, 2004, is directed to a system and an apparatus for determining the state of charge of a battery, the battery has a sensing device to measure the battery capacity. A reusable state of charge indicator has a microprocessor compatible with different battery types and pre-programmable to determine state of charge based on value received from the sensing device. The battery and the state of charge indicator are electrically connected using one or more contact for providing voltage drop information from the sensing device to the microprocessor. This state of charge indicator is removably attachable to the battery.

US Publication No. 20060017582 for battery monitor by inventors Lockhart et al., filed Aug. 23, 2005 and published Jan. 26, 2006, is directed to an apparatus and method for monitoring at least one battery condition. An ac signal is applied to a battery. A difference between a signal output from the battery and a threshold determines a battery condition. The determined battery condition is transmitted remotely from the battery location either wirelessly or through a network to controller and/or is visibly displayed at the battery location.

U.S. Pat. No. 8,410,783 for detecting an end of life for a battery using a difference between an unloaded battery voltage and a loaded battery voltage by inventor Staton, filed Sep. 30, 2009 and issued Apr. 2, 2013, is directed to one particular implementation conforming to aspects of the present invention takes the form of a method for detecting the end of life of a battery for an electronic device. The method may include calculating the voltage of the battery in an unloaded state, holding the sampled unloaded battery voltage, measuring a loaded battery voltage, calculating the difference between the unloaded and loaded battery voltages and amplifying the calculated difference. Other implementations may take the form of a circuit to perform one or more of the operations of the above method. The circuit may include a sample and hold section and a differential amplifier to provide the amplified difference to a microcontroller for analysis. The microcontroller may also provide a warning or indication to the device or to a user of the device when the battery nears the end of life.

US Publication No. 20120105009 for systems and methods for determining battery state of charge by inventor Yao, filed Jul. 23, 2009 and published May 3, 2012, is directed to systems and methods for determining a state of charge of a battery are provided. The system includes a power source configured to provide a charging current to a battery. A controller is included and configured to determine a state of charge of the battery based on impedance of a battery during a discharge time period based on an impedance and a state of charge relation-ship of a battery during a charge time period.

US Publication No. 20140218200 for circuit protection apparatus by inventor Chen, filed Feb. 2, 2013 and published Aug. 7, 2014, is directed to a circuit protection apparatus. A peripheral interface includes a first power node and a second power node. The circuit protection apparatus includes an auxiliary power supply circuit, a power converter, a first switch, a second switch, a power switch circuit, a warning circuit, and a controller. When a load is plugged to the peripheral interface, the first switch turns on, and the controller is enabled and outputs a control signal, so as to drive the power converter to output power. When the current between input terminal and output terminal of the power switch circuit is larger than a predetermined current, the controller receives the error flag logical voltage outputted by the power switch circuit, cuts off the current between input terminal and output terminal of the power switch circuit, and stops the operations of the power converter.

SUMMARY OF THE INVENTION

In some aspects, the present invention provides an indicator device for monitoring a state of charge of one or more batteries or battery packs, the device including at least one voltage input connector configured to be electrically coupled to at least one voltage output connector of a battery or battery pack. The device further includes control electronics capable of measuring a voltage received from the at least one voltage input connector when the voltage input connector is electrically coupled to the at least one voltage output connector of the battery or battery pack to be monitored, and wherein the control electronics are programmed to process an input voltage range and/or a battery discharge characteristic to determine a state of charge. The device further includes at least one indicator which indicates the state of charge, wherein the at least one voltage input connector, the control electronics, and the at least one indicator are in electronic communication, and wherein the state of charge shown by the at least one indicator is related to the voltage measured by the control electronics.

In certain aspects, the indicator device comprises between one and four voltage input connectors, wherein the between one and four voltage input connectors are each in electronic communication with separate control electronics and separate indicators, and wherein each separate indicator in electronic communication with the between one and four voltage input connectors operate independently.

In other aspects, the present invention provides a device for monitoring a state of charge of one or more batteries or battery packs, wherein the state of charge is communicated through a communications interface to a network instead of indicated through one or more indicators on the device. In certain aspects, the device is configured to communicate with a mobile device coupled to the network.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 22 shows a table of number of bars, statuses, maximum voltages, and minimum voltages for one embodiment of the present invention.

DETAILED DESCRIPTION

Figure 1:
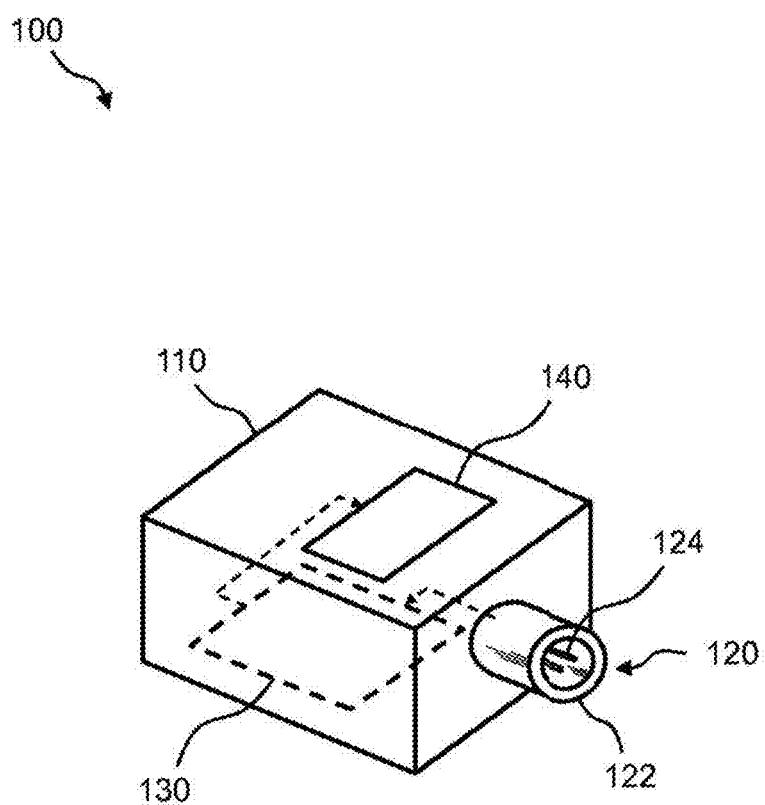
FIG. 1 illustrates a perspective view of an example of a pluggable single-connector SOC indicator according to one embodiment of the present invention.

In some embodiments, the present invention provides a pluggable state-of-charge (SOC) indicator. In one embodiment, the pluggable SOC indicator supports one voltage input, hereafter called the pluggable single-connector SOC indicator. The pluggable single-connector SOC indicator is designed for use with one type of battery or battery pack. Namely, a slip-on, non-locking connector of the pluggable single-connector SOC indicator is coupled to a mating slip-on, non-locking connector of the battery or battery pack. The charge status of the battery or battery pack is provided on an indicator of the pluggable single-connector SOC indicator.

In another embodiment, the pluggable SOC indicator supports two voltage inputs, hereafter called the pluggable dual-connector SOC indicator. The pluggable dual-connector SOC indicator is designed for use with two different types of batteries or battery packs. Namely, a first slip-on, non-locking connector of the pluggable dual-connector SOC indicator is coupled to a mating slip-on, non-locking connector of a first battery or battery pack. The charge status of the first battery or battery pack is provided on a first indicator of the pluggable dual-connector SOC indicator. Additionally, a second slip-on, non-locking connector of the pluggable dual-connector SOC indicator is coupled to a mating slip-on, non-locking connector of a second battery or battery pack. The charge status of the second battery or battery pack is provided on a second indicator of the pluggable dual-connector SOC indicator. The first indicator and the second indicator of the pluggable dual-connector SOC indicator operate independently. Advantageously, this allows the pluggable dual-connector SOC indicator to monitor the voltage of two batteries or battery packs at the same time. Additionally, the two batteries or battery packs can have different operating voltages and/or connectors. Instead of carrying two pluggable single-connector SOC indicators (one for each operating voltage and/or connector), a user can carry one pluggable dual-connector SOC indicator, which provides both a weight and volume savings. In another embodiment, the connector plugs are locking or semi-locking, depending on the battery connection to be joined. The connector also can be in the form of a receptacle. Any connectors may present with either pins or sockets.

In yet another embodiment, the pluggable SOC indicator supports four voltage inputs, hereafter called the pluggable quad-connector SOC indicator. The pluggable quad-connector SOC indicator is designed for use with four different types of batteries or battery packs. Namely, a first slip-on, non-locking connector of the pluggable quad-connector SOC indicator is coupled to a mating slip-on, non-locking connector of a first battery or battery pack. The charge status of the first battery or battery pack is provided on a first indicator of the pluggable quad-connector SOC indicator. A second slip-on, non-locking connector of the pluggable quad-connector SOC indicator is coupled to a mating slip-on, non-locking connector of a second battery or battery pack. The charge status of the second battery or battery pack is provided on a second indicator of the pluggable quad-connector SOC indicator. A third slip-on, non-locking connector of the pluggable quad-connector SOC indicator is coupled to a mating slip-on, non-locking connector of a third battery or battery pack. The charge status of the third battery or battery pack is provided on a third indicator of the pluggable quad-connector SOC indicator. Further, a fourth slip-on, non-locking connector of the pluggable quad-connector SOC indicator is coupled to a mating slip-on, non-locking connector of a fourth battery or battery pack. The charge status of the fourth battery or battery pack is provided on a fourth indicator of the pluggable quad-connector SOC indicator. The first indicator, second indicator, third indicator, and fourth indicator of the pluggable quad-connector SOC indicator operate independently. Advantageously, this allows the pluggable quad-connector SOC indicator to monitor the voltage of four batteries or battery packs at the same time. Additionally, the four batteries or battery packs can have different operating voltages and/or connectors. Instead of carrying four pluggable single-connector SOC indicators (one for each operating voltage and/or connector) or two pluggable dual-connector SOC indicators, a user can carry one pluggable quad-connector SOC indicator, which provides both a weight and volume savings.

The pluggable SOC indicator is not limited to supporting one, two, or four voltage inputs. The pluggable single-connector SOC indicator, the pluggable dual-connector SOC indicator, and the pluggable quad-connector SOC indicator are exemplary only. The pluggable SOC indicator can support any number of voltage inputs that can be implemented in a practical manner. Namely, the pluggable SOC indicator is a pluggable 1-to-n SOC indicator, wherein 'n' is the number of connectors. In some embodiments, the pluggable SOC supports between one and four voltage inputs, including one, two, three, or four voltage inputs.

As previously described, SOC indicators are often incorporated into the battery housing itself or removably attachable to the battery housing, resulting in continuous monitoring of battery life. One application of the SOC indicator is for military applications. Soldiers often carry 27.2-45.4 kg (60-100 lbs) of gear, including equipment (e.g., radios) in their rucksack or attached to their vest that operate on rechargeable batteries. As the rechargeable batteries are often inside a rucksack behind the soldier, it would not be practical to have a SOC indicator on the battery housing because the soldier would have to take the rucksack off, open the rucksack, and then check the SOC of the battery. To resume operations, the soldier would then have to close the rucksack and put the rucksack back on. This presents a danger to the soldier because it would reduce reaction time and leave the soldier vulnerable to attack. In contrast, the present invention can be used to intermittently measure the voltage of a rechargeable battery while the battery is inside a rucksack. Military batteries often have a connector in the base, such as the batteries disclosed in U.S. application Ser. No. 15/470,378, which is incorporated herein by reference in its entirety. A soldier can easily measure the voltage of a battery inside a rucksack by attaching a right angle connector cable to the battery and placing an unused end of the cable outside the rucksack (e.g., attached to the exterior of the rucksack or the soldier's vest) where it is easily accessible. When the soldier needs to check the voltage of the battery, the soldier simply attaches the SOC indicator to the unused end of the right angle connector cable attached to the battery. This method of intermittently measuring battery voltage extends the battery run time.

Further, the equipment that operates on rechargeable batteries is often mission critical (e.g., radios). For example, if the voltage of the battery powering the radio falls below the operating voltage (i.e., the battery dies), the soldiers relying on the radio for communicating information with command are at a higher risk of attack. This may also leave the soldiers with incomplete or obsolete information regarding their mission. Additionally, other equipment powered by rechargeable batteries may be necessary to complete the mission and, thus, the battery must be sufficiently charged to operate the equipment when needed. Therefore, every minute of battery run time should be preserved.

There are only a few critical moments where a battery voltage must be monitored: when removing the battery from the charger to ensure that the battery has a full charge; when getting ready to deploy on a mission to ensure that the soldier is departing with a full charge; after a certain amount of soldier determined time as measured in hours or minutes of use (e.g., 90 minutes, 2 hours, 4 hours, 6 hours, 8 hours); and at the end of the mission so that the soldier becomes more familiar with how the battery responds to field usage and develops motor memory. Intermittent monitoring provides an advantage over continuous monitoring because it does not present a constant and unnecessary drain on the battery.

Additionally, one aspect of the pluggable SOC indicators, such as the pluggable single-connector SOC indicator, the pluggable dual-connector SOC indicator, and the pluggable quad-connector SOC indicator, is that they are under power only when plugged into the battery or battery pack to be monitored. Therefore, the pluggable SOC indicators present a load or drain on the battery or battery pack to be monitored only during the brief period of time in which they are plugged in and the SOC is indicated. By contrast, the prior art, including built-in SOC indicators, act as a load, operating continuously and constantly draining the battery that they are monitoring. This continuous operation of built-in SOC indicators reduces the shelf life of the battery and increases maintenance required to make sure the battery has a charge.

In one example, the shelf life of the battery with a built-in SOC indicator was 2 weeks and the shelf life of a battery without a built-in SOC indicator was 6 months. In military applications, soldiers need to be able to quickly mobilize and, therefore, need to be able to quickly pack their gear. If the battery has a built-in SOC indicator, the battery may not be fully charged when packed, despite being recently charged. Again, this can reduce the ability of the soldiers to communicate with command and may leave equipment non-operational, placing both the soldiers and the mission in jeopardy.

Additionally, battery housings must be modified to use SOC indicators that are incorporated into the battery housing itself or removably attachable to the battery housing, which presents an additional site for contamination by environmental elements (e.g., dust and water). Contamination by environmental elements may cause battery fires or impair the function of the battery. In contrast, the present invention can be used without modifying the battery housing. The SOC indicator of the present invention attaches to the battery or battery pack to be monitored via existing load connectors on the battery or battery pack.

What is needed is a SOC indicator that can be used to measure the voltage of a battery or battery pack, yet only is a load or drain on the battery or battery pack to be monitored only during the brief period of time in which they are actively attached to the SOC indicator. Lithium ion batteries were developed in the 1970s and have been in commercial use since the 1990s. There is a long-felt unmet need for a SOC indicator that is easily transported by a human to intermittently measure the voltage of batteries or battery packs that power radios and other electronic devices critical to survival.

None of the prior art provides a SOC indicator that can be used to measure the voltage of a battery or battery pack that is easily transportable by a human, is not incorporated into the battery housing itself, and only drains the battery in the short interval the SOC indicator is measuring the voltage of the battery.

Referring now to the drawings in general, the illustrations are for the purpose of describing a preferred embodiment of the invention and are not intended to limit the invention thereto. Any and all text associated with the figures as illustrated is hereby incorporated by reference in this detailed description.

FIG. 1 is a perspective view of an example of a pluggable single-connector SOC indicator 100 according to one embodiment of the pluggable SOC indicators. The pluggable single-connector SOC indicator 100 includes a housing 110. Mounted on one end of the housing 110 is a voltage input jack 120. The voltage input jack 120 includes a shroud 122 and one or more pins 124. In one embodiment, the shroud 122 is formed of metal or plastic that is wear resistant or a so called "barrel" connector.

The pluggable single-connector SOC indicator 100 further includes certain control electronics 130 for sensing the voltage received from the voltage input jack 120 when the voltage input jack 120 is electrically coupled to a voltage output connector of an external battery or battery pack (not shown) of interest. In some embodiments, the voltage input jack 120 is electrically coupled to the voltage output connector of the external battery or battery pack (not shown) of interest through a mechanical connection (also referred to herein as "electro-mechanically" connected). The control electronics 130 then drive an indicator 140, which shows the state of charge. The voltage input jack 120 is any type of connector needed to electrically couple to a voltage output connecter (not shown) of the external battery or battery pack of interest. Further, the voltage input jack 120 is configured to be reversibly and intermittently electrically coupled or electro-mechanically connected to the voltage output connector of the battery or battery pack.

Accordingly, in one example, the voltage input jack 120 and the voltage output connecter (not shown) of the external battery or battery pack are both a slip-on, non-locking type of connector. In a preferred embodiment, the battery connector is a female-type of connector that is press-fitted onto the voltage input jack 120, which is a male-type of connector. In another example, the voltage input jack 120 is a female-type of connector that is press-fitted onto the battery connector, which is a male-type of connector. Similarly, pins and sockets are selected to mate with the output connector of the battery of interest. Generally, any permutation of pins, sockets or pinout corresponding to those of the battery of interest can be used. In a preferred embodiment, the voltage input jack 120 is a circular connector. Generally, any shape of connector corresponding to that of the battery of interest can be used.

In a preferred embodiment, the voltage input jack is a circular, non-locking panel mounted plug (e.g., Fischer Connectors part number SF 105 A087).

Figure 23:
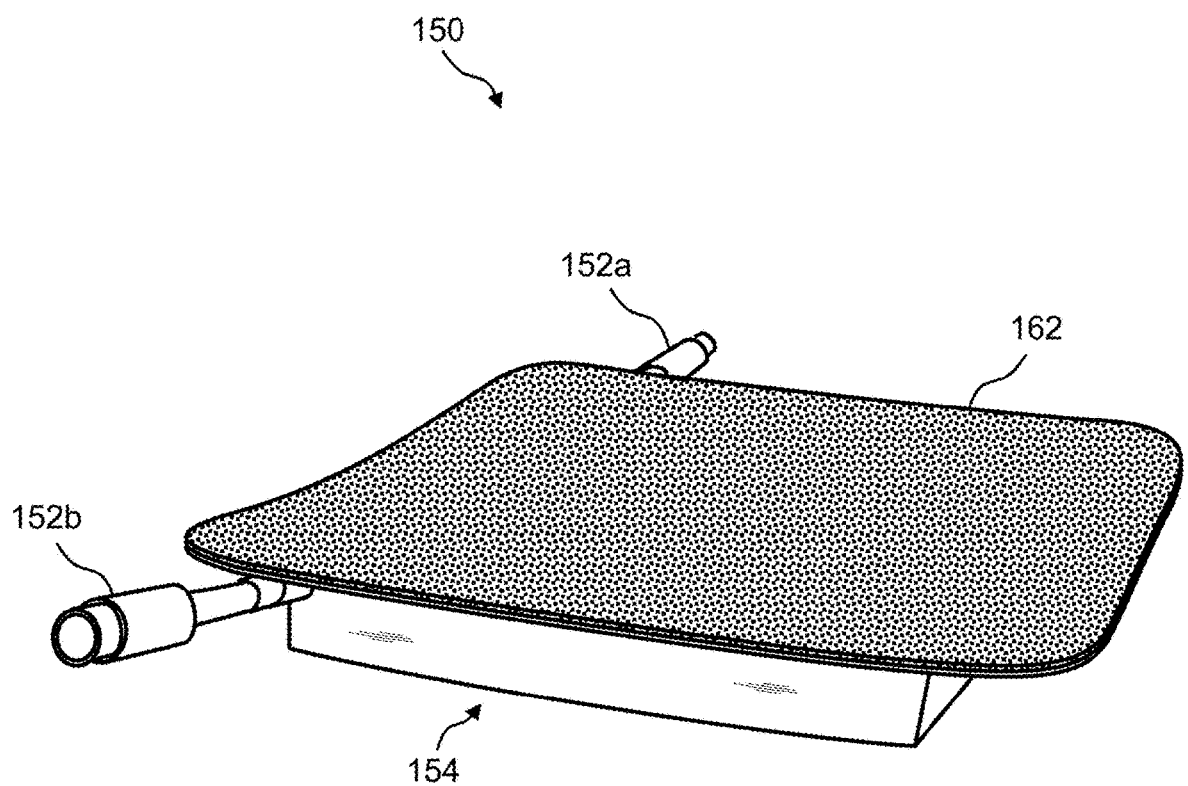
FIG. 23 illustrates an example of a battery that can be used with a pluggable SOC indicator.

In another preferred embodiment, the voltage input jack is modified from Tajimi Electronics part number R04-P5m, which is a male circular type of connector. The female type of connector (Tajimi Electronics part number R04-P5f) is used for a wearable battery pack, such as that disclosed in US Publication No. 20160118634, which is incorporated herein by reference in its entirety. FIG. 23 illustrates a perspective view of a battery of a portable battery pack. Namely, FIG. 23 shows a view of the back plate 162 side of battery 150 including leads 152a, 152b, and a battery cover 154. To create the voltage input jack, the threaded locking ring is removed to make the connector non-locking. The body of the connector is removed, leaving the contact block. The contact block is then screwed into a machined metal mount specifically designed to accept the contact block, thereby creating the voltage input jack.

The connector is a slip-on, non-locking type of connector in a preferred embodiment. For example, the SOC indicator may be used for military applications. Soldiers carry a significant amount of gear, including equipment (e.g., radios) that run on rechargeable batteries. The slip-on, non-locking connector allows the soldier to quickly and easily disengage the SOC indicator without having to unlock the connector. This minimizes the amount of time needed to obtain a voltage measurement, allowing the soldier to focus on the mission and/or tasks at hand. Additionally, the slip-on, non-locking connector allows the soldier to easily use the SOC indicator while the soldier is in motion.

The voltage input jack of the SOC indicator is connected to the voltage output connector of the battery or battery pack via a cable in one embodiment. For example, in a military application, a soldier can easily measure the voltage of a battery inside a rucksack by attaching a right angle connector cable to the battery and placing an unused end of the cable outside the rucksack (e.g., attached to the exterior of the rucksack or the soldier's vest) where it is easily accessible. When the soldier needs to check the voltage of the battery, the soldier simply attaches the SOC indicator to the unused end of the right angle connector cable attached to the battery. In one embodiment, the cable is a split cable (e.g., a Y-cable). Some batteries have multiple packages of cells and each package of cells is attached to a separate voltage output connector. A split cable allows the SOC indicator to monitor the voltage of the battery from the same voltage output connector attached to the load.

Figure 2:
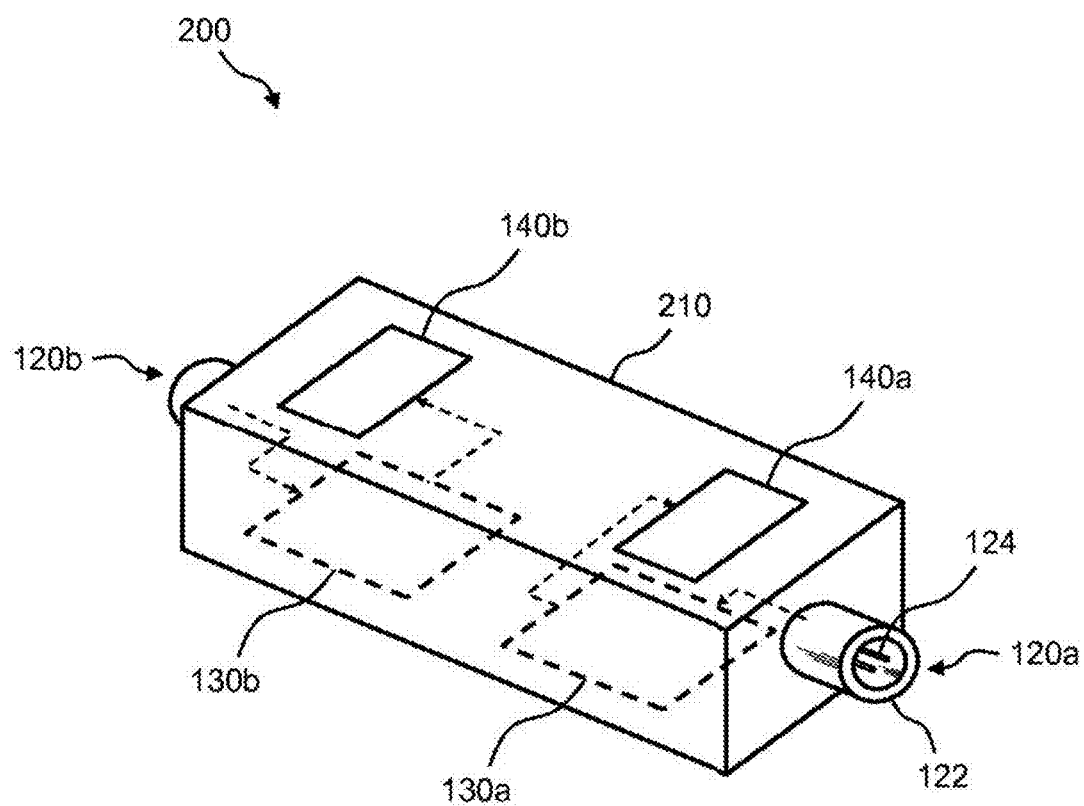
FIG. 2 illustrates a perspective view of an example of a pluggable dual-connector SOC indicator according to another embodiment of the present invention.

FIG. 2 illustrates a perspective view of an example of a pluggable dual-connector SOC indicator 200 according to another embodiment of the pluggable SOC indicators. The pluggable dual-connector SOC indicator 200 is substantially the same as pluggable single-connector SOC indicator 100 of FIG. 1 except that it supports two instances of the voltage input jack 120, two instances of the control electronics 130, and two instances of the indicator 140. The housing 110 is sized and shaped accordingly. For example, in pluggable dual-connector SOC indicator 200, a voltage input jack 120a is mounted on one end of the housing 110, while a voltage input jack 120b is mounted on the opposite end of the housing 110. Further, the voltage input jack 120a feeds the control electronics 130a, which then drives an indicator 140a. The voltage input jack 120b feeds the control electronics 130b, which then drives an indicator 140b.

The voltage input jack 120a, the control electronics 130a, and the indicator 140a operate separately and independently from the voltage input jack 120b, the control electronics 130b, and the indicator 140b. Further, the voltage input jack 120a and the voltage input jack 120b can be different depending on the type of battery or battery pack to be mated thereto. Namely, the voltage input jack 120a, the control electronics 130a, and the indicator 140a are tailored for monitoring the SOC of one type of battery or battery pack, while the voltage input jack 120b, the control electronics 130b, and the indicator 140b are tailored for monitoring the SOC of another type of battery or battery pack. In one example, the control electronics 130a are programmed to process a certain input voltage range and/or battery discharge characteristic, while the control electronics 130b are programmed to process a different input voltage range and/or battery discharge characteristic. Advantageously, this allows a user to carry only one pluggable dual-connector SOC indicator for the two different types of batteries or battery packs, which provides both a weight and volume savings over carrying two pluggable single-connector SOC indicators (one for each type of battery).

Preferably, the diameter and/or shape of the connector is different for different input voltages. In a preferred embodiment, the voltage input jack 120a is a non-locking panel mounted plug (e.g., Fischer Connectors part number SF 105 A087) and the voltage input jack 120b is modified from Tajimi part number R04-P5m as described above. The voltage input jack 120a has a higher input voltage (e.g., 29.4V) and larger diameter, while the voltage input jack 120b has a lower input voltage (e.g., 16.8V) and smaller diameter in a preferred embodiment. This coordination of higher voltage with larger diameter and lower voltage with smaller diameter makes it intuitive for an operator to use the correct voltage input jack for the correct battery or battery pack voltage. Advantageously, this coordination allows an operator to associate the correct voltage input jack with the correct battery or battery pack in the dark. This coordination also means that a soldier does not have to push buttons to program a device to get a SOC reading. Thus, the voltage input jack is the inherent voltage selector. Further, the operator can use the SOC indicator without looking at a device to obtain the voltage selection, thereby maintaining situational awareness and eyes on combat.

Figure 3:
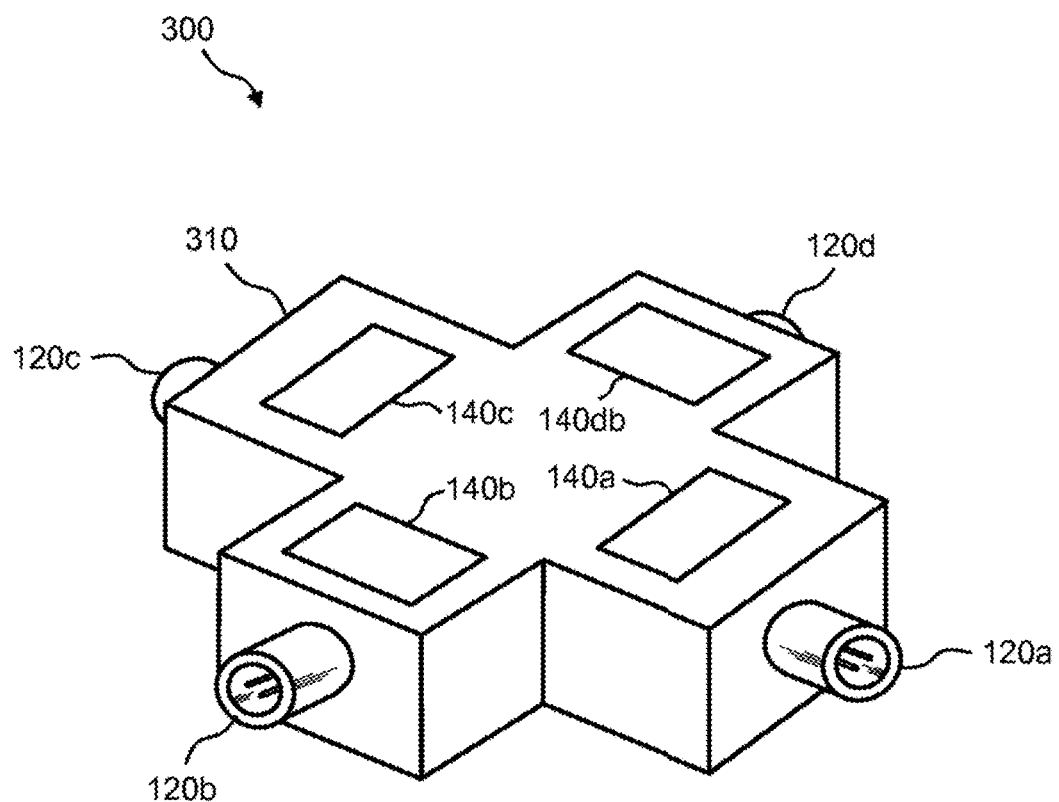
FIG. 3 illustrates a perspective view of an example of a pluggable quad-connector SOC indicator according to yet another embodiment of the present invention.

FIG. 3 illustrates a perspective view of an example of a pluggable quad-connector SOC indicator 300 according to yet another embodiment of the pluggable SOC indicators. The pluggable quad-connector SOC indicator 300 is substantially the same as pluggable single-connector SOC indicator 100 of FIG. 1 except that it supports four instances of the voltage input jack 120, four instances of the control electronics 130, and four instances of the indicator 140. The housing 110 is sized and shaped accordingly to accommodate each of the aforementioned elements. For example, the pluggable quad-connector SOC indicator 300 is formed in a cross-configuration that includes a voltage input jack 120a, a voltage input jack 120b, a voltage input jack 120c, and a voltage input jack 120d, as shown. Further, the voltage input jack 120a feeds control electronics 130a, which then drives an indicator 140a. The voltage input jack 120b feeds control electronics 130b, which then drives an indicator 140b. The voltage input jack 120c feeds control electronics 130c, which then drives an indicator 140c. The voltage input jack 120d feeds control electronics 130d, which then drives an indicator 140d.

In some embodiments, the four voltage input jacks 120, the four control electronics 130, and the four indicators 140 operate separately and independently from each other. Further, the voltage input jacks 120a, 120b, 120c, and 120d can be different depending on the type of battery or battery pack to be mated thereto. Namely, the voltage input jack 120a, the control electronics 130a, and the indicator 140a are tailored for monitoring the SOC of one type of battery or battery pack; the voltage input jack 120b, the control electronics 130b, and the indicator 140b are tailored for monitoring the SOC of another type of battery or battery pack; the voltage input jack 120c, the control electronics 130c, and the indicator 140c are tailored for monitoring the SOC of yet another type of battery or battery pack, while the voltage input jack 120d, the control electronics 130d, and the indicator 140d are tailored for monitoring the SOC of still another type of battery or battery pack. In one example, the control electronics 130a, 130b, 130c, and 130d are programmed to process different input voltage ranges and/or battery discharge characteristics, respectively. Advantageously, this allows a user to carry only one pluggable quad-connector SOC indicator for the four different types of batteries or battery packs, which provides a weight savings over carrying four pluggable single-connector SOC indicators (one for each type of battery or battery pack) or two pluggable dual-connector SOC indicators. More details of an example of the control electronics 130 are shown and described herein below with reference to FIG. 4.

Figure 4:
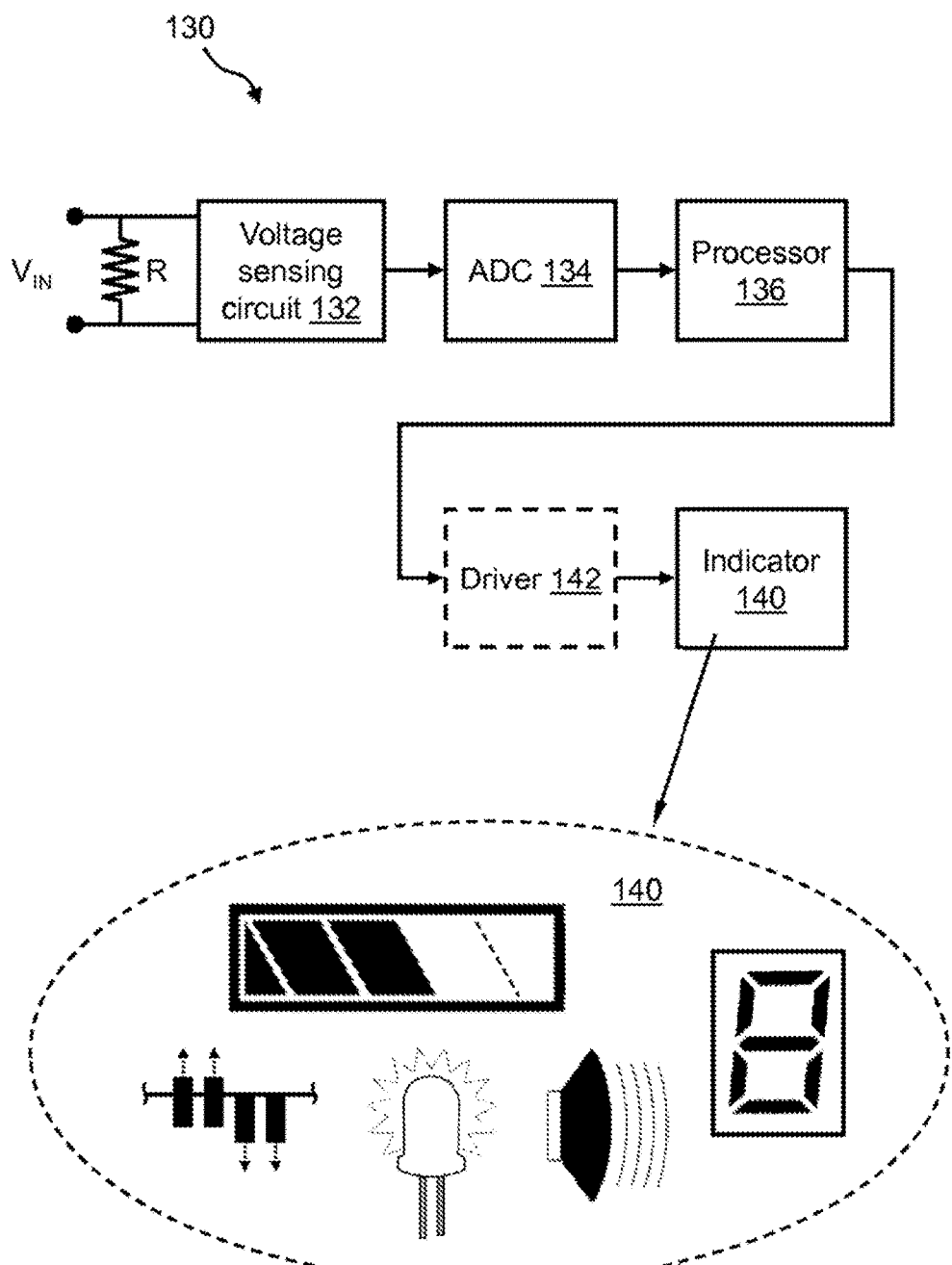
FIG. 4 illustrates a block diagram of an example of the control electronics of a pluggable SOC indicator.

FIG. 4 illustrates a block diagram of an example of one instance of the control electronics 130 of the pluggable SOC indicators. In this example, the control electronics 130 includes a voltage sensing circuit 132, an analog-to-digital converter (ADC) 134, a processor 136, the indicator 140, and optionally a driver 142.

The voltage sensing circuit 132 can be any standard voltage sensing circuit, such as those found in volt meters. An input voltage VIN is supplied via the voltage input jack 120. In one embodiment, the voltage sensing circuit 132 is designed to sense any direct current (DC) voltage in the range of from about 0 volts DC to about 50 volts DC. In one embodiment, the voltage sensing circuit 132 includes standard amplification or de-amplification functions for generating an analog voltage that correlates to the amplitude of the input voltage VIN that is present. The ADC 134 receives the analog voltage from the voltage sensing circuit 132 and performs a standard analog-to-digital conversion.

The processor 136 manages the overall operations of the pluggable SOC indicator. The processor 136 is any controller, microcontroller, or microprocessor that is capable of processing program instructions.

The indicator 140 is any visual, audible, or tactile mechanism for indicating the state of charge of the battery or battery pack with which the pluggable SOC indicator is used. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, a visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full battery, two of the LEDs are yellow to indicate that charging will soon be required, and one LED is red to indicate that the battery is almost drained. In a preferred embodiment, at least three bars, lights, or numbers are used to indicate the state of charge. Alternatively, an LCD displays the voltage of battery or battery pack as measured by the SOC indicator.

One example of an audible indicator is any sounds via an audio speaker, such as beeping sounds, wherein five beeps indicates greatest charge and one beep indicates least charge. Another example of an audible indicator is vibration sounds via any vibration mechanism (e.g., vibration motor used in mobile phones), wherein five vibration sounds indicates greatest charge and one vibration sound indicates least charge.

One example of a tactile indicator is any vibration mechanism (e.g., vibration motor used in mobile phones), wherein five vibrations indicate greatest charge and one vibration indicate least charge. Another example of a tactile indicator is a set of pins that rise up and down to be felt in Braille-like fashion, wherein five raised pins indicates greatest charge and one raised pin indicates least charge.

In one example, the processor 136 is able to drive indicator 140 directly. In one embodiment, the processor 136 is able to drive directly a 5-bar LCD or a seven-segment numeric LCD. In another example, however, the processor 136 is not able to drive indicator 140 directly. In this case, the driver 142 is provided, wherein the driver 142 is specific to the type of indicator 140 used in the control electronics 130.

Additionally, the processor 136 includes internal programmable functions for programming the expected range of the input voltage VIN and the correlation of the value the input voltage VIN to what is indicated at the indicator 140. In other words, the discharge curve of the battery or battery pack of interest can be correlated to what is indicated at indicator 140. In one embodiment, the processor 136 is programmed based on a percent discharged or on an absolute value present at the input voltage VIN.

By way of example, the battery or battery pack of interest is a 24-volt battery and the indicator 140 is a 5-bar LCD. In one example, the processor 136 is programmed as follows: VIN=24V–21.01V, then display 5 bars; VIN=21V–18.01V, then display 4 bars; VIN=18V–16.01V, then display 3 bars; VIN=16V–14.01V, then display 2 bars; and VIN=below 14.01V, then display 1 bar.

FIG. 22 shows a table of number of bars, statuses, maximum voltages, and minimum voltages for one embodiment of the present invention. In one example, a 16.8V lithium ion rechargeable battery is measured with a SOC indicator that has a 5-bar LCD. The LCD displays 5 flashing bars when fully charged (e.g., on the charger), 5 steady bars when VIN=16.8V–16.2V, 4 steady bars when VIN=16.2V–15.5V, 3 steady bars when VIN=14.5V–13.7V, 2 steady bars when VIN=13.7V–13.2V, 1 steady bar when VIN=13.7V–13.2V, and 1 flashing bar when VIN=13.2V–10.5V. If VIN is below 10.5V, no bars are displayed on the LCD. In another example, a 29.4V lithium ion rechargeable battery is measured with a SOC indicator that has a 5-bar LCD. The LCD displays 5 flashing bars when fully charged (e.g., on the charger), 5 steady bars when VIN=29.4V–28.3V, 4 steady bars when VIN=28.3V–27V, 3 steady bars when VIN=27V–25.4V, 2 steady bars when VIN=25.4V–24V, 1 steady bar when VIN=24V–23V, and 1 flashing bar when VIN=23V–18.4V. If VIN is below 18.4V, no bars are displayed on the LCD. In one embodiment, the voltage sensing circuit includes standard amplification or de-amplification functions for generating an analog voltage between 0-5V that correlates to the amplitude of the input voltage VIN that is present.

In one embodiment, the SOC indicator includes a switch (e.g., pushbutton switch, toggle switch, slide switch, rotary switch, rocker switch, DIP switch) to turn the SOC indicator on and off. The SOC indicator is selectively activated and deactivated by the switch. The SOC indicator presents a load or drain on the battery or battery pack to be monitored only when actively coupled to the battery.

Figure 5A:
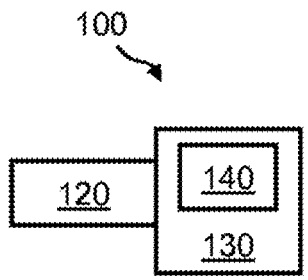
FIG. 5A illustrates a block diagram of a pluggable single-connector SOC indicator, wherein the indicators operate independently.
Figure 5B:
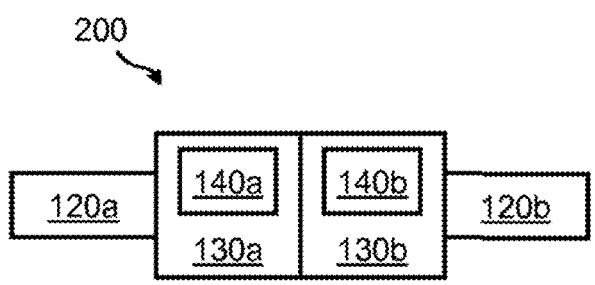
FIG. 5B illustrates a block diagram of a pluggable dual-connector SOC indicator, wherein the indicators operate independently.
Figure 5C:
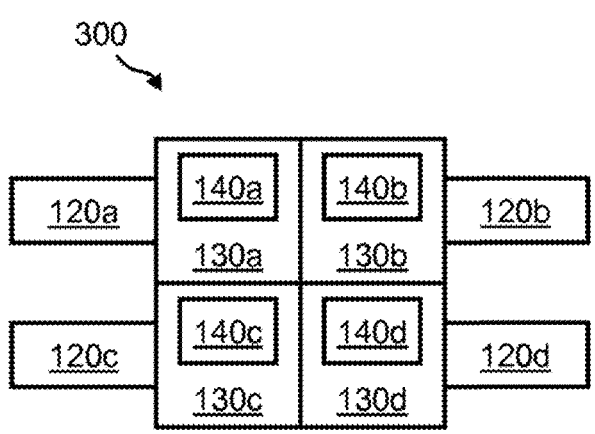
FIG. 5C illustrates a block diagram of a pluggable quad-connector SOC indicator, wherein the indicators operate independently.

FIG. 5A, FIG. 5B, and FIG. 5C illustrate block diagrams of example configurations of the pluggable single-connector SOC indicator 100, the pluggable dual-connector SOC indicator 200, and pluggable quad-connector SOC indicator 300, wherein the indicators operate independently. Namely, the modularity of the pluggable SOC indicators is shown in FIG. 5A, FIG. 5B, and FIG. 5C.

For example, FIG. 5A shows the pluggable single-connector SOC indicator 100 that includes the one voltage input jack 120 supplying one instance of the control electronics 130. FIG. 5B shows the pluggable dual-connector SOC indicator 200 that includes the voltage input jack 120a supplying the control electronics 130a and the voltage input jack 120b supplying the control electronics 130b, wherein the control electronics 130a and 130b operate separately and independently. In one example, the voltage input jack 120a and the control electronics 130a support a 24-volt battery and the voltage input jack 120b and the control electronics 130b support a 20-volt battery. FIG. 5C shows the pluggable dual-connector SOC indicator 200 that includes the voltage input jack 120a supplying the control electronics 130a, the voltage input jack 120b supplying the control electronics 130b, the voltage input jack 120c supplying the control electronics 130c, and the voltage input jack 120d supplying the control electronics 130d, wherein the control electronics 130a, 130b, 130c, and 130d operate separately and independently. In one example, the voltage input jack 120a and the control electronics 130a support a 24-volt battery, the voltage input jack 120b and the control electronics 130b support a 20-volt battery, the voltage input jack 120c and the control electronics 130c support a 16-volt battery, and the voltage input jack 120d and the control electronics 130d support a 12-volt battery.

Figure 6A:
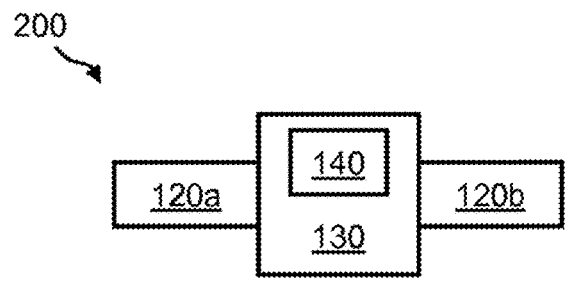
FIG. 6A illustrates a block diagram of a pluggable dual-connector SOC indicator, wherein the indicators do not operate independently.
Figure 6B:
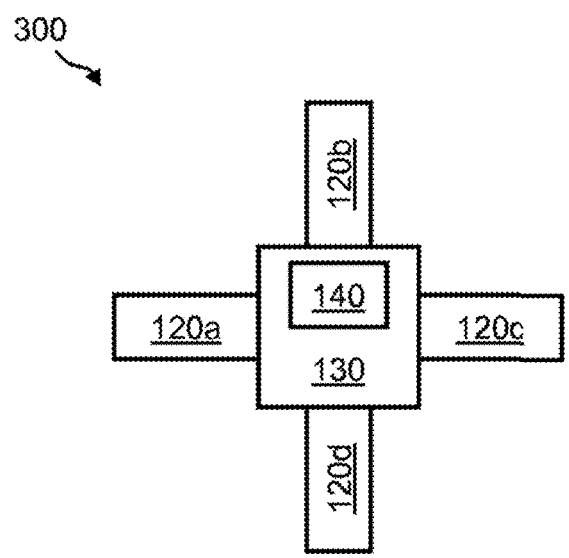
FIG. 6B illustrates a block diagram of a pluggable quad-connector SOC indicator, wherein the indicators do not operate independently.

FIG. 6A and FIG. 6B illustrate block diagrams of example configurations of the pluggable dual-connector SOC indicator 200 and the pluggable quad-connector SOC indicator 300, wherein the indicators do not operate independently. Namely, in these configurations, multiple voltage input jacks 120 supply one instance of the control electronics 130 and one instance of the indicator 140. For example and referring now to FIG. 6A, the control electronics 130 and the indicator 140 are used in common with both voltage input jacks 120a and 120b. The voltage input jacks 120a and 120b are connected in parallel at the input voltage VIN of the control electronics 130. Referring now to FIG. 6B, the control electronics 130 and the indicator 140 are used in common with the four voltage input jacks 120a, 120b, 120c, and 120d. The voltage input jacks 120a, 120b, 120c, and 120d are connected in parallel at the input voltage VIN of the control electronics 130.

Because the expected voltage range at the multiple voltage input jacks 120 can be different, the programmable function of the processor 136 can differ for each of the multiple voltage input jacks 120. Therefore, in FIG. 6A and FIG. 6B, the voltage sensing circuit 132 can provide a select line to the processor 136 for each of the multiple voltage input jacks 120. For example, in FIG. 6A the voltage sensing circuit 132 provides two select lines to the processor 136 for uniquely identifying the voltage input jack 120a or 120b when in use, while in FIG. 6B the voltage sensing circuit 132 provides four select lines to the processor 136 for uniquely identifying the voltage input jack 120a, 120b, 120c, or 120d when in use. Based on the state of the select lines, the program function that correlates to the voltage input jack 120 that is in use is automatically selected. In one example, when the voltage input jack 120a is detected the 24-volt battery program function in the processor 136 is automatically selected, when the voltage input jack 120b is detected the 20-volt battery program function in the processor 136 is automatically selected, when voltage input jack 120c is detected the 16-volt battery program function in the processor 136 is automatically selected, and when the voltage input jack 120d is detected the 12-volt battery program function in the processor 136 is automatically selected.

A limitation of the configuration shown in FIG. 6A and FIG. 6B as compared with the configuration shown in FIG. 5B and FIG. 5C, however, is that only one voltage input jack 120 can be in use at any given time.

Figure 7:
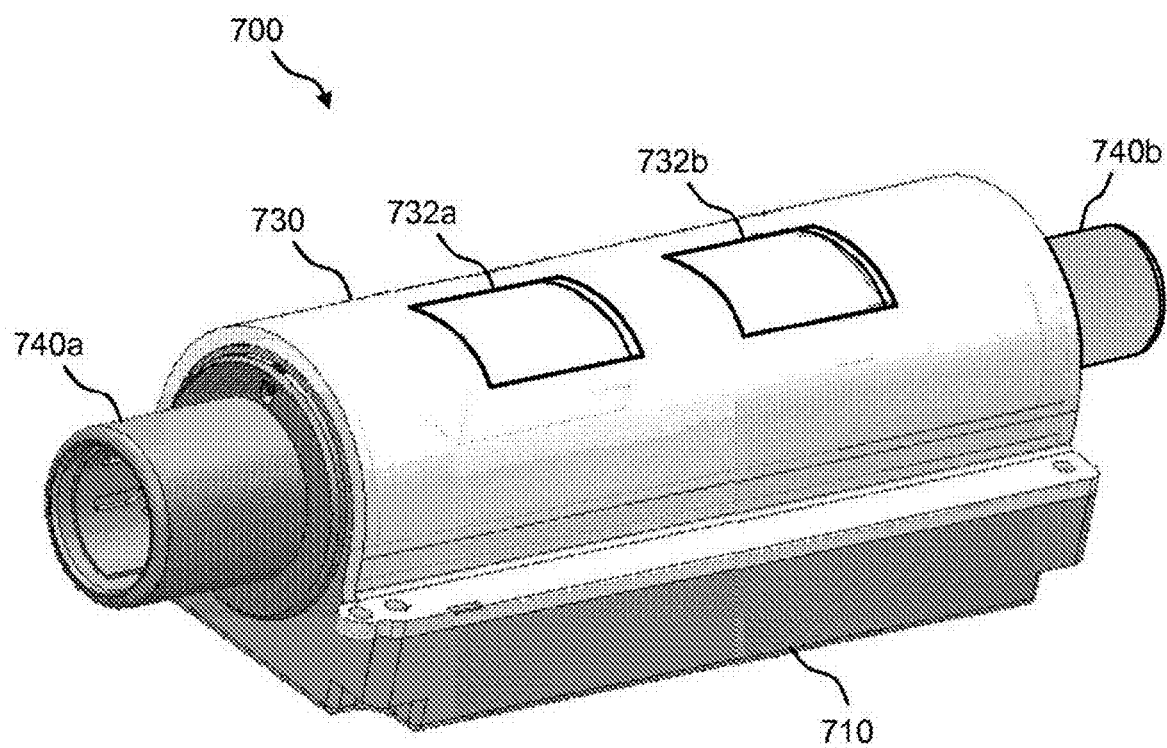
FIG. 7 illustrates a perspective view of a specific example of a pluggable dual-connector SOC indicator.

More details of an example of the pluggable dual-connector SOC indicator 200 configured according to FIG. 5B are shown and described herein below with reference to FIG. 7 through FIG. 16. Namely, FIG. 7 illustrates a perspective view of a pluggable dual-connector SOC indicator 700, which is one example implementation of the pluggable dual-connector SOC indicator 200 of FIG. 2 that is configured according to FIG. 5B.

In this example, the pluggable dual-connector SOC indicator 700 includes a base plate 710 and a cover 730. The cover 730 further includes two viewing windows 732 (e.g., viewing windows 732a and 732b) through which the user can view the SOC indicators 140. Mounted on the two ends of the base plate 710 are voltage input jacks 740a and 740b, respectively. In this example, the voltage input jacks 740a and 740b are different, such as different size (e.g., length and diameter) and pin configuration.

The length of the base plate 710 and the cover 730 of the pluggable dual-connector SOC indicator 700 is, for example, about 7.6 cm (about 3 inches). The width of the base plate 710 and the cover 730 of the pluggable dual-connector SOC indicator 700 is, for example, about 3.8 cm (about 1.5 inches). The overall height of the pluggable dual-connector SOC indicator 700 is, for example, about 3 cm (about 1.2 inches). The overall length of the pluggable dual-connector SOC indicator 700 (including the voltage input jacks 740a and 740b) is, for example, about 10.2 cm (about 4 inches). The overall weight of the pluggable dual-connector SOC indicator 700 is about 28.3 g (3 ounces) in a preferred embodiment. In an alternative embodiment, the SOC indicator weighs less than about 226.8 g (8 ounces).

The base plate 710 and the cover 730 are formed of any lightweight, rigid material, such as, but not limited to, aluminum and molded plastic. The base plate 710 and the cover 730 can be formed of the same or of different materials. In one example, the base plate 710 is formed of aluminum and the cover 730 is formed of molded plastic.

Forming the cover 730 out of an opaque material entails making an opening for each 5-bar LCD. This makes the SOC indicator vulnerable to contamination by environmental elements (e.g., dust and water), which increases the likelihood of failure for the SOC indicator. Additionally, each 5-bar LCD would have to be secured so it could not be pushed down into the housing 710.

Therefore, the cover 730 is preferably made of a transparent material. In a preferred embodiment, the cover 730 is comprised of a clear plastic. The viewing windows 732a and 732b are preferably comprised of polished clear plastic to direct the user's attention to the 5-bar LCDs 720a and 720b. The remainder of the cover 730 (excluding the viewing windows 732a and 732b) is comprised of a clear plastic that is roughened or clouded. This decreases distraction by the control electronics inside the housing and redirects the user's attention to the viewing windows 732a and 732b. Additionally, the viewing windows 732a and 732b provide an extra layer of protection for the 5-bar LCDs 720a and 720b, much like a screen protector provides an extra layer of protection for a smartphone. This increases the durability of the SOC indicator.

The weight and dimensions of the SOC indicator are important because it must be easily transported by a human. As previously described, soldiers often carry 27.2-45.4 kg (60-100 lbs) of gear in their rucksack or attached to their vest. Additional weight slows soldiers down and also makes it more likely that they will suffer injuries to their body (e.g., injuries to the back, shoulders, hips, knees, ankles, and feet). As such, the material for the base plate and the cover must be lightweight. The dimensions of the SOC indicator must also be small enough that it is easily attached to a vest, placed in a pocket, or carried in a rucksack.

Figure 8:
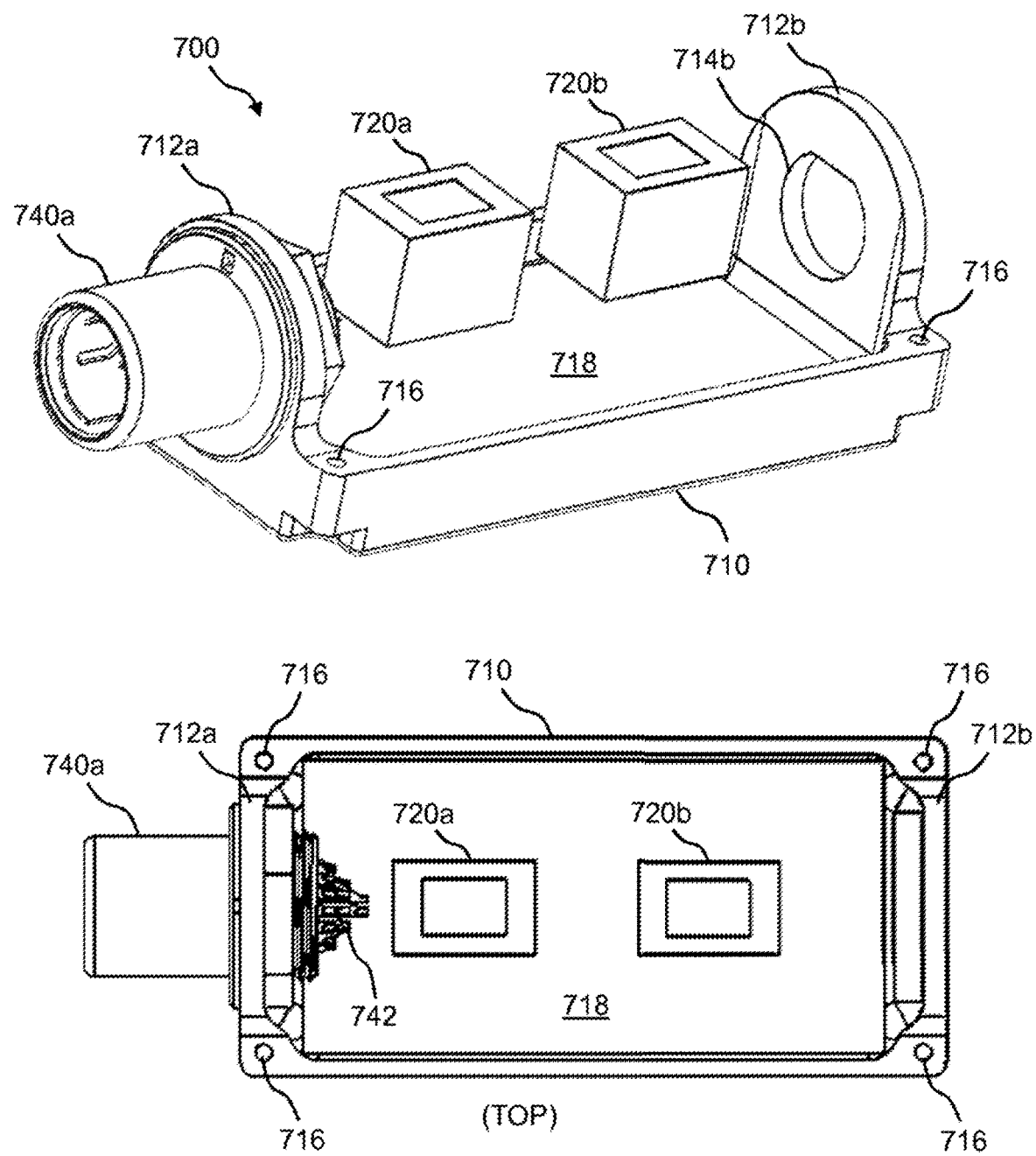
FIG. 8 illustrates a perspective view and a plan view of the pluggable dual-connector SOC indicator shown in FIG. 7, absent the cover thereof.

FIG. 8 is a perspective view and a plan view of the pluggable dual-connector SOC indicator 700 of FIG. 7, absent the cover 730 and revealing more details thereof. Namely, the base plate 710 includes an end plate 712a and an end plate 712b, wherein the end plate 712a is designed to receive voltage input jack 740a and the end plate 712b is designed to receive voltage input jack 740b (not shown in FIG. 8) through opening 714b. There is, for example, an opening 716 at each corner of the base plate 710. Openings 716 are used for fastening the cover 730 to the base plate 710 via screws (e.g., if opening 716 is a threaded hole), pins, lock pins, push pins, and other methods of fastening the cover (not shown).

The end plates 712a and 712b are preferably comprised of aluminum. The end plates 712a and 712b must be substantial enough to support the weight of voltage input jacks 740a and 740b, which are panel mounted and comprised of metal in a preferred embodiment. The end plates 712a and 712b must also be substantial enough to endure repeated daily push and pull cycles as the voltage input jacks 740a and 740b are intermittently electrically coupled to and decoupled from batteries or battery packs.

Installed inside of the base plate 710 is a printed circuit board (PCB) 718 on which two instances of control electronics 130 is implemented (e.g., control electronics 130a and 130b, not shown). In one example, the control electronics 130a is programmed for a 24-volt battery and the control electronics 130b is programmed for a 20-volt battery.

Figure 9:
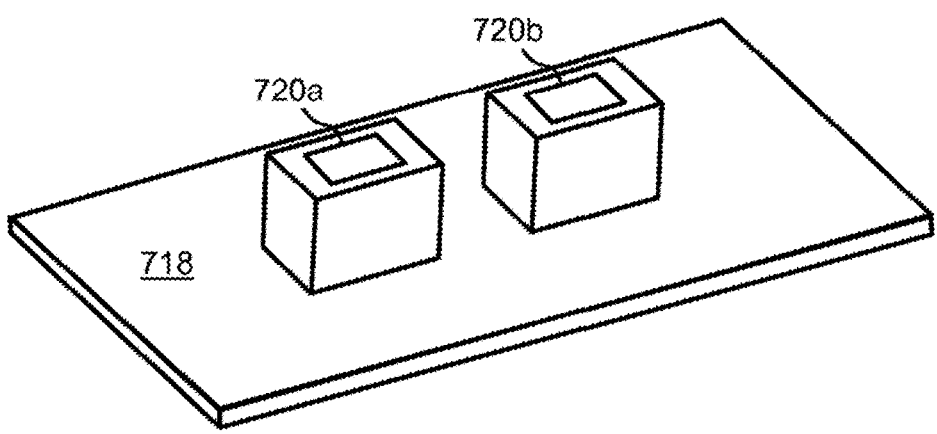
FIG. 9 illustrates a perspective view of a printed circuit board and indicators of the pluggable dual-connector SOC indicator shown in FIG. 7.
Figure 10:
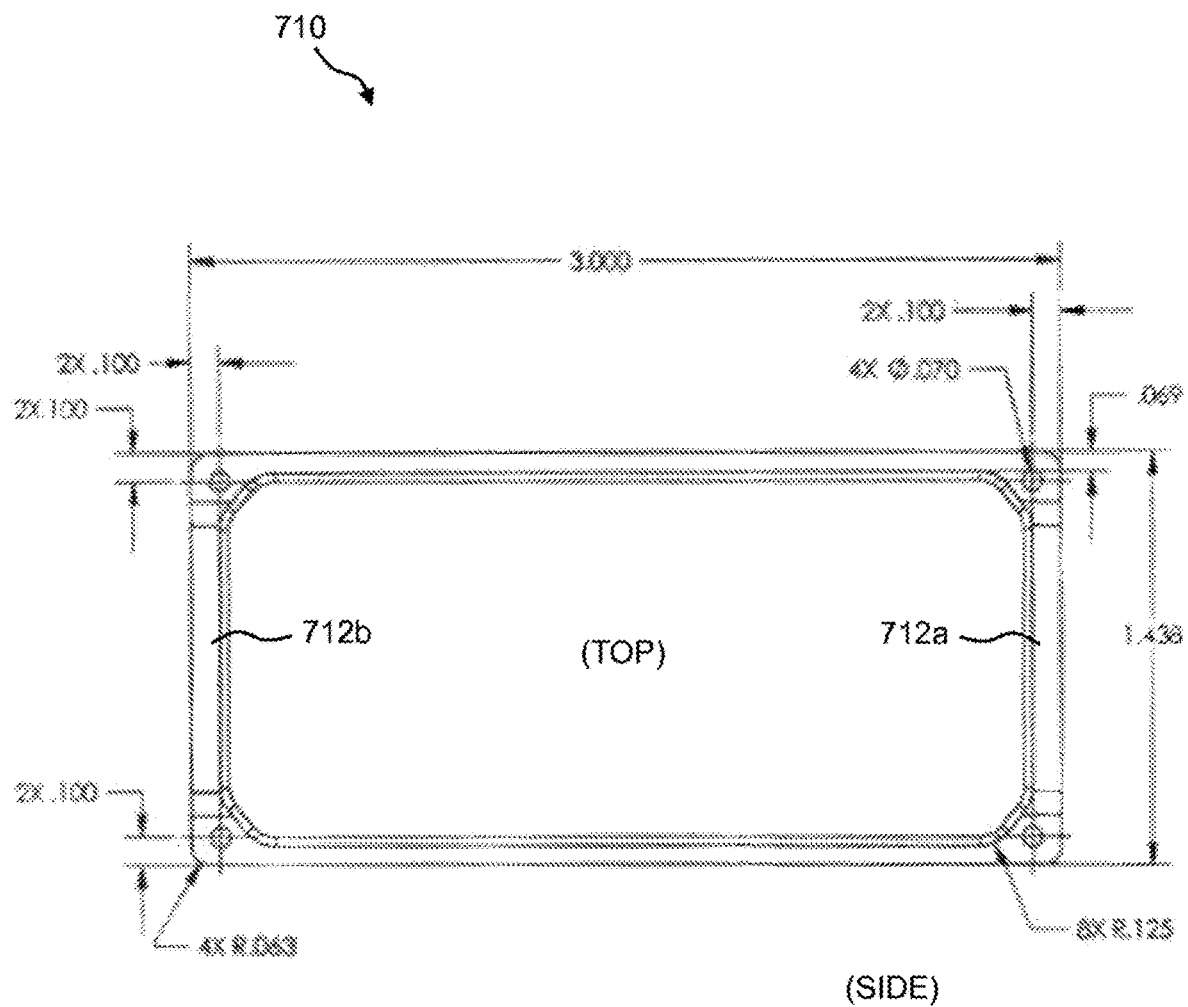
FIG. 10 illustrates a top view of the base plate of the pluggable dual-connector SOC indicator shown in FIG. 7.
Figure 11:
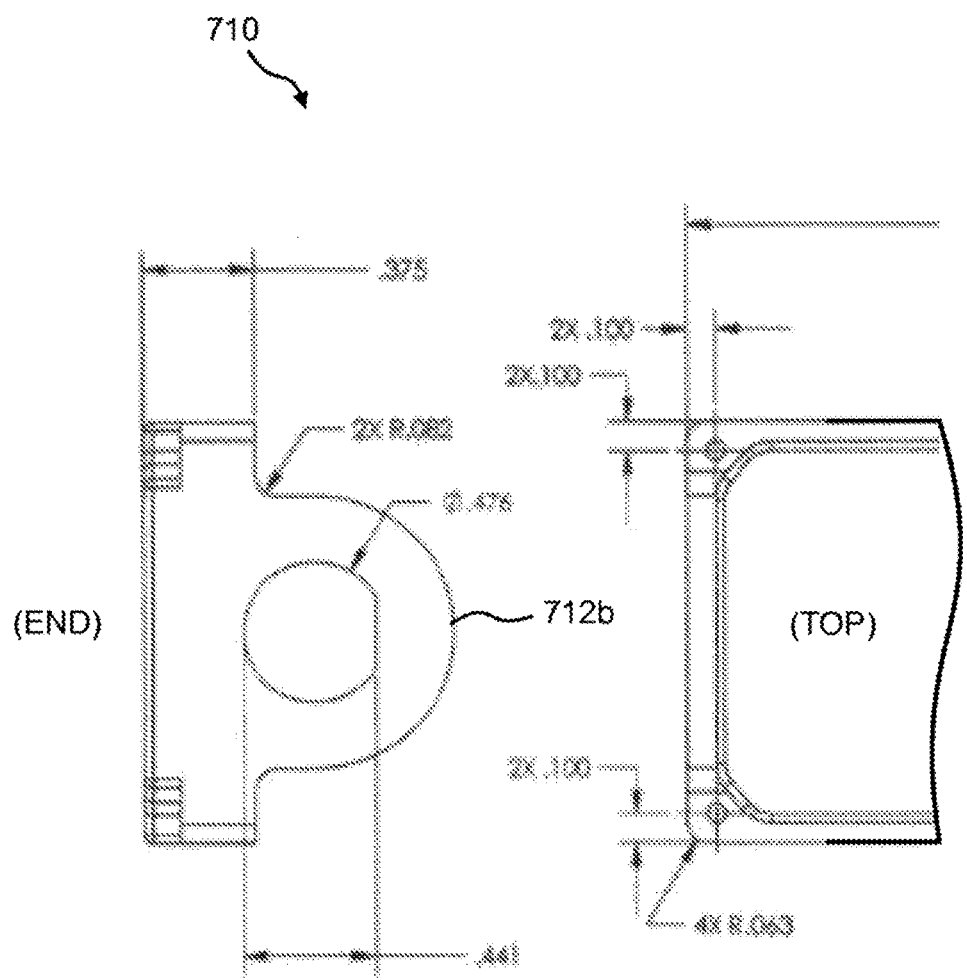
FIG. 11 illustrates an end view of the base plate of the pluggable dual-connector SOC indicator shown in FIG. 7.
Figure 12:
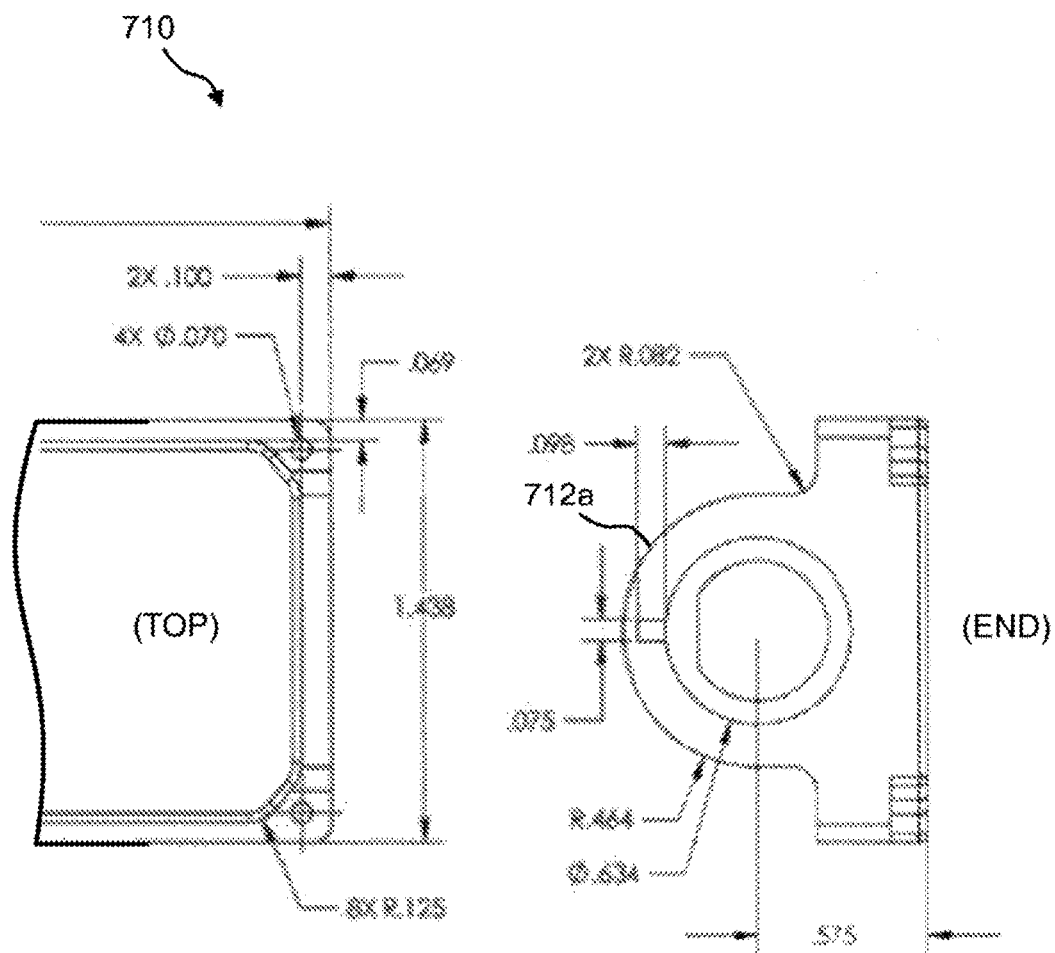
FIG. 12 illustrates another end view of the base plate of the pluggable dual-connector SOC indicator shown in FIG. 7.
Figure 13:
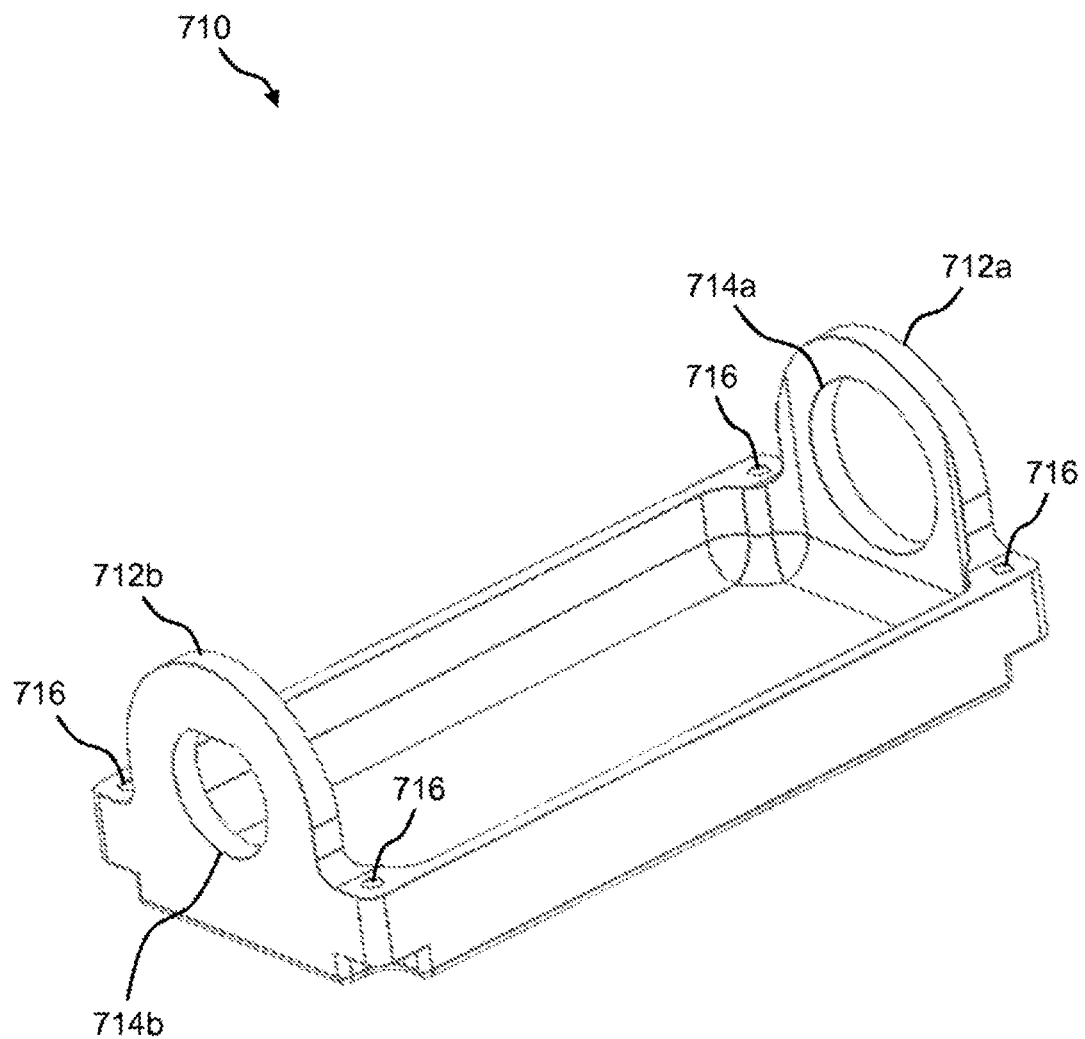
FIG. 13 illustrates a perspective view of a base plate of the pluggable dual-connector SOC indicator shown in FIG. 7.

Mounted atop the PCB 718 are two 5-bar LCDs 720 (e.g., 5-bar LCDs 720a and 720b), which are examples of indicators 140. Further, the voltage input jack 740a includes a configuration of pins 742 that are electrically connected to the control electronics 130 on the PCB 718. FIG. 9 is another view of the PCB 718 and the 5-bar LCDs 720a and 720b of the pluggable dual-connector SOC indicator 700 of FIG. 7.

FIG. 10, FIG. 11, FIG. 12, and FIG. 13 are various views of an example of the base plate 710 of the pluggable dual-connector SOC indicator 700 of FIG. 7, showing more details and example dimensions thereof.

Figure 14:
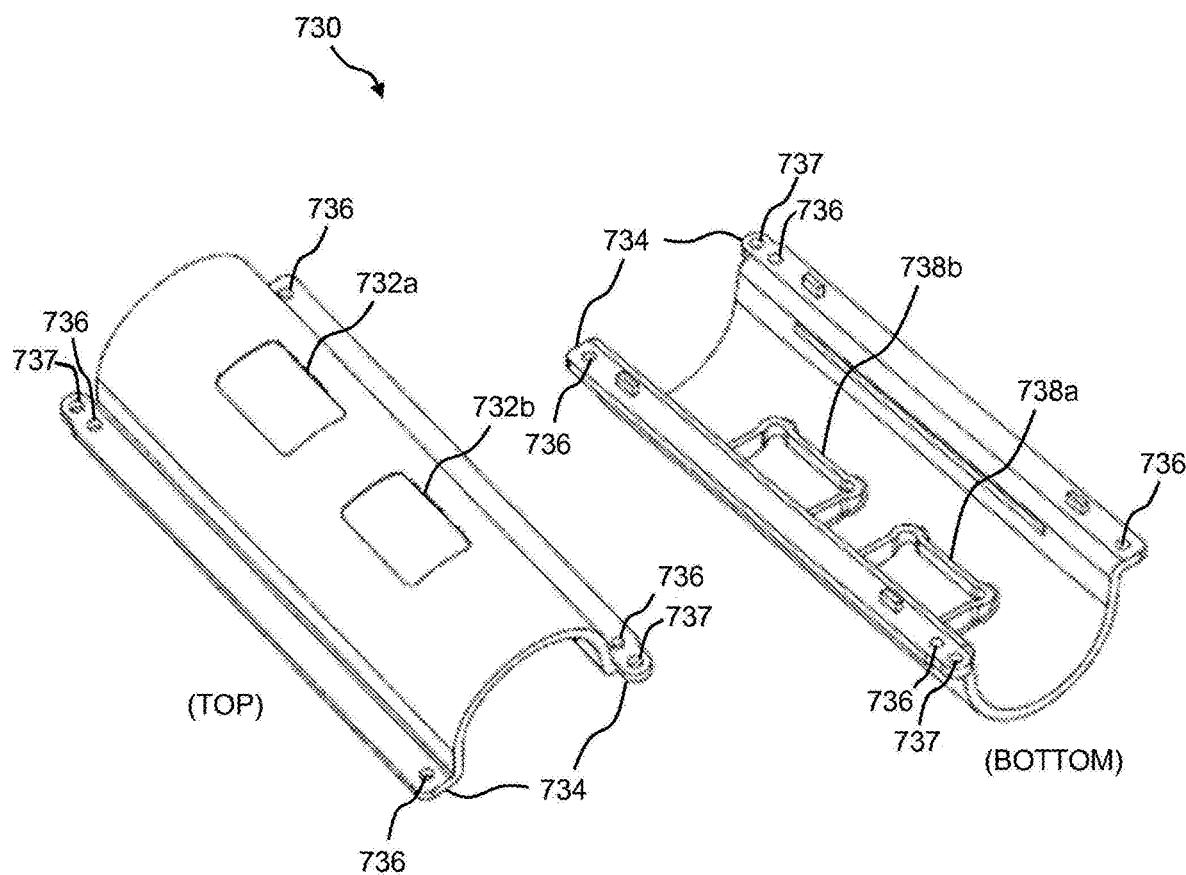
FIG. 14 illustrates a top perspective view and a bottom perspective view of a cover of the pluggable dual-connector SOC indicator shown in FIG. 7.
Figure 15:
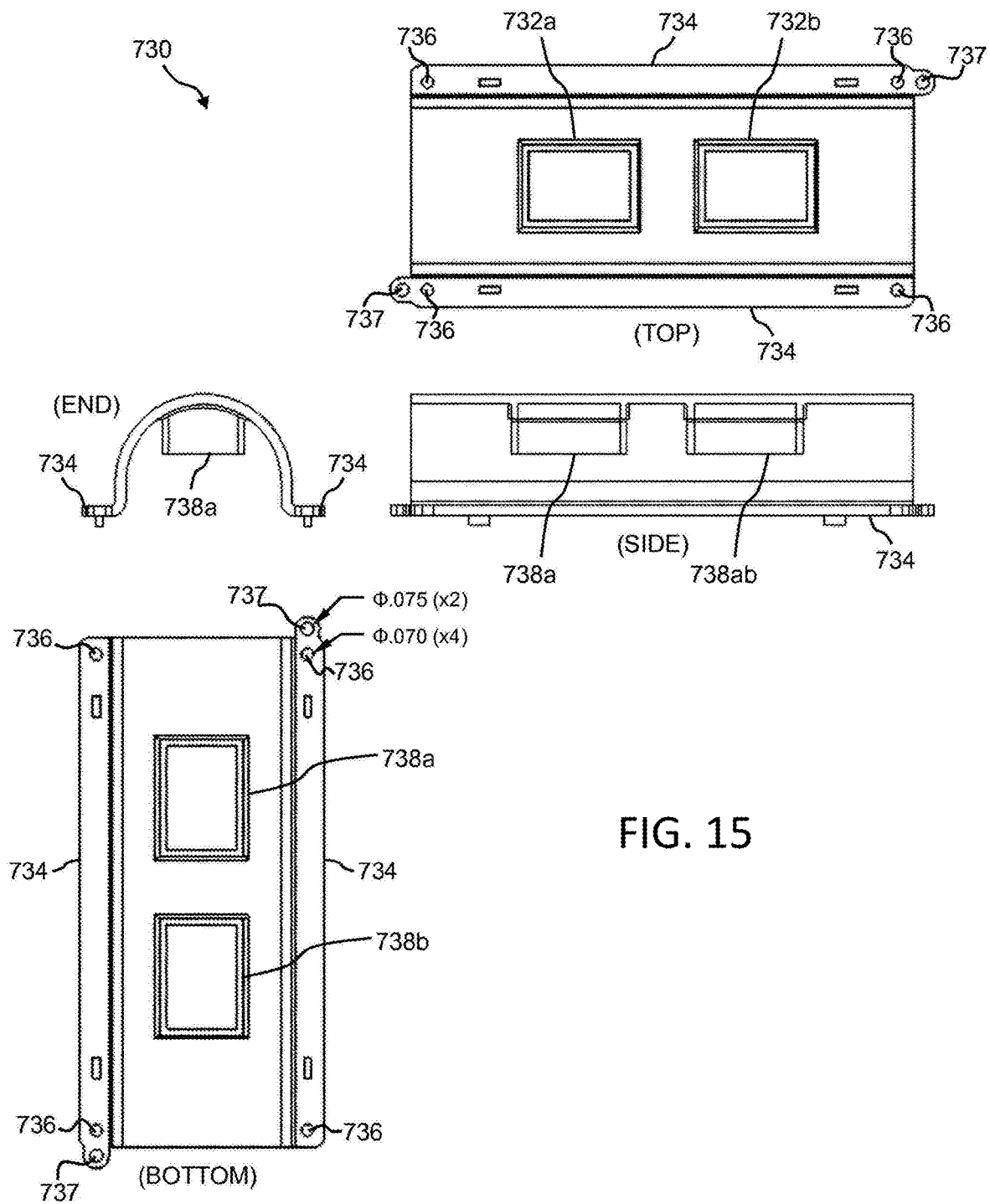
FIG. 15 illustrates a top view, a side view, an end view, and a bottom view of the cover of the pluggable dual-connector SOC indicator shown in FIG. 7.

FIG. 14 and FIG. 15 are various views of an example of the cover 730 of the pluggable dual-connector SOC indicator 700 of FIG. 7, showing more details thereof. More specifically, the cover 730 includes two side rails 734 that run along the length thereof. The two side rails 734 are designed to fit atop the edges of the base plate 710. Multiple holes 736 are provided in the two side rails 734, wherein the holes 736 can be aligned with the threaded holes 716 in the base plate 710 and wherein screws (not shown) can be used to fasten the cover 730 to the base plate 710. Multiple holes 737 are provided in the two side rails 734, wherein each of the holes 737 can be used to attach a dust cap (not shown) with a lanyard (not shown) to cover a corresponding at least one voltage input jack 740. The dust cap (not shown) protects the SOC indicator from dust, dirt, and other environmental contaminants. Additionally, a pair of alignment features 738 (e.g., alignment features 738*a* and 738*b*) are provided on the inside of the cover 730. Namely, alignment feature 738*a* is used to align the viewing window 732*a* of the cover 730 with the 5-bar LCD 720*a* on the PCB 718 (see FIG. 9). Likewise, alignment feature 738*b* is used to align the viewing window 732*b* of the cover 730 with the 5-bar LCD 720*b* on the PCB 718 (see FIG. 9).

As previously mentioned, the cover 730 is preferably comprised of plastic. In a preferred embodiment, the cover 730 has a curvature to mate with the base plate 710 and the end plates 712*a* and 712*b*. This curvature allows for a greater percentage of the exterior surface area to be comprised of plastic, which results in a weight savings.

In a preferred embodiment, the cover 730 lists the names of the product(s) associated with the input voltage of the external battery or battery pack by each indicator. Additionally or alternatively, the cover 730 lists the maximum voltage of the external battery or battery pack by each indicator.

Figure 16:
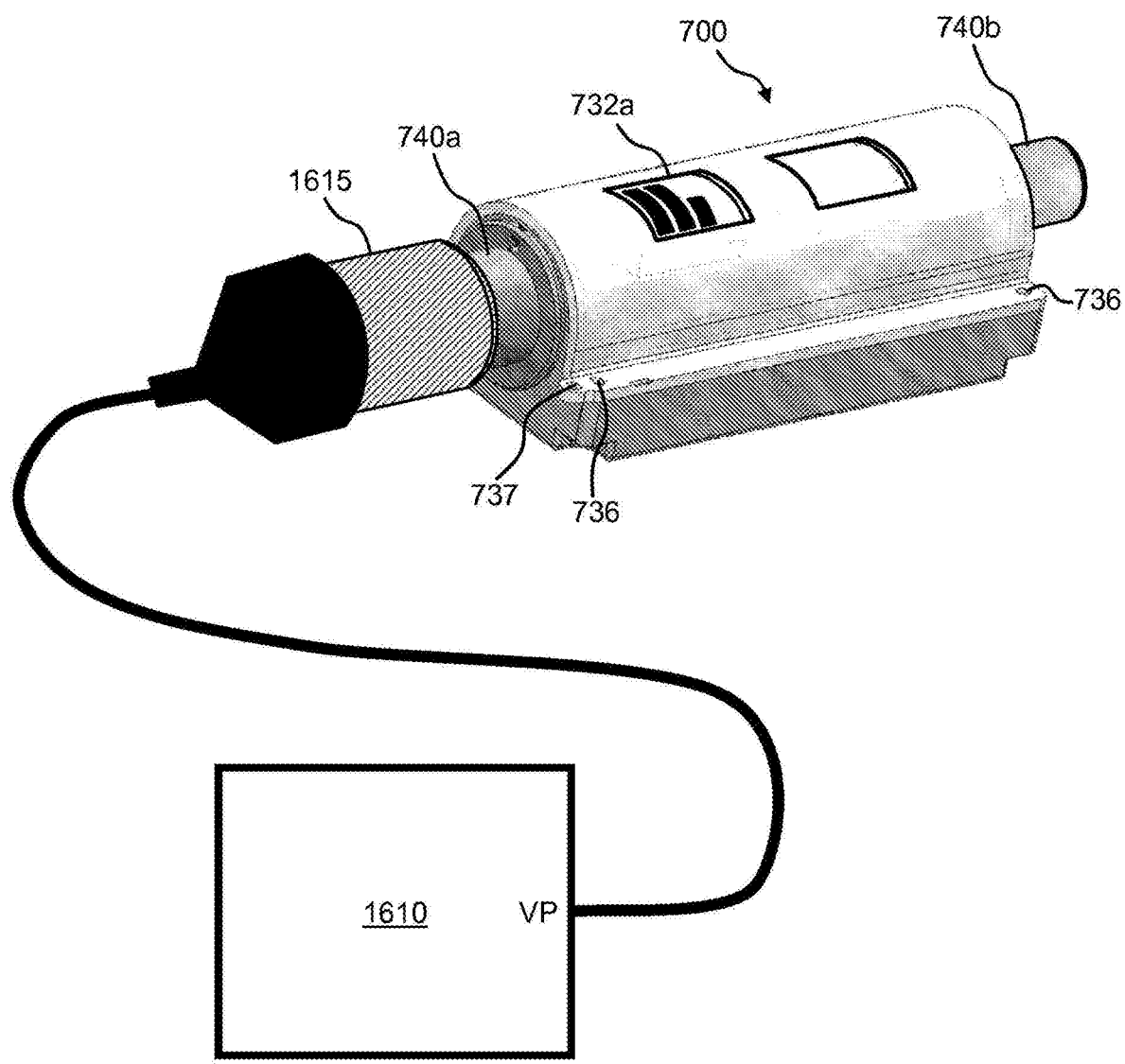
FIG. 16 shows an example of the pluggable dual-connector SOC indicator shown in FIG. 7 when in use.

FIG. 16 shows a view (not to scale) of an example of the pluggable dual-connector SOC indicator 700 when in use. For example, FIG. 16 shows a battery or battery pack 1610, which can be any rechargeable battery or battery pack. The battery or battery pack 1610 includes a voltage out port VP. The voltage out port VP can be used by the pluggable dual-connector SOC indicator 700 for monitoring the state of charge of the battery or battery pack 1610. In this example, a connector 1615 (e.g., a slip-on, non-locking connector) is provided at the voltage out port VP of the battery or battery pack 1610.

The connector 1615 can be press-fitted upon, for example, the voltage input jack 740*a* of the pluggable dual-connector SOC indicator 700. In this example, the processor 136 of the control electronics 130*a* of the pluggable dual-connector SOC indicator 700 is programmed according to the specifications of the battery or battery pack 1610. Further, the type of voltage input jack 740*a* installed in the pluggable dual-connector SOC indicator 700 corresponds to the type of connector 1615 of the battery or battery pack 1610. When the pluggable dual-connector SOC indicator 700 is plugged into the connector 1615 of the battery or battery pack 1610, the state of charge of the battery or battery pack 1610 displayed on the 5-bar LCD 720*a* and is visible in the viewing window 732*a*, wherein the state of charge is displayed according to the programmed functions of the pluggable dual-connector SOC indicator 700.

Figure 17:
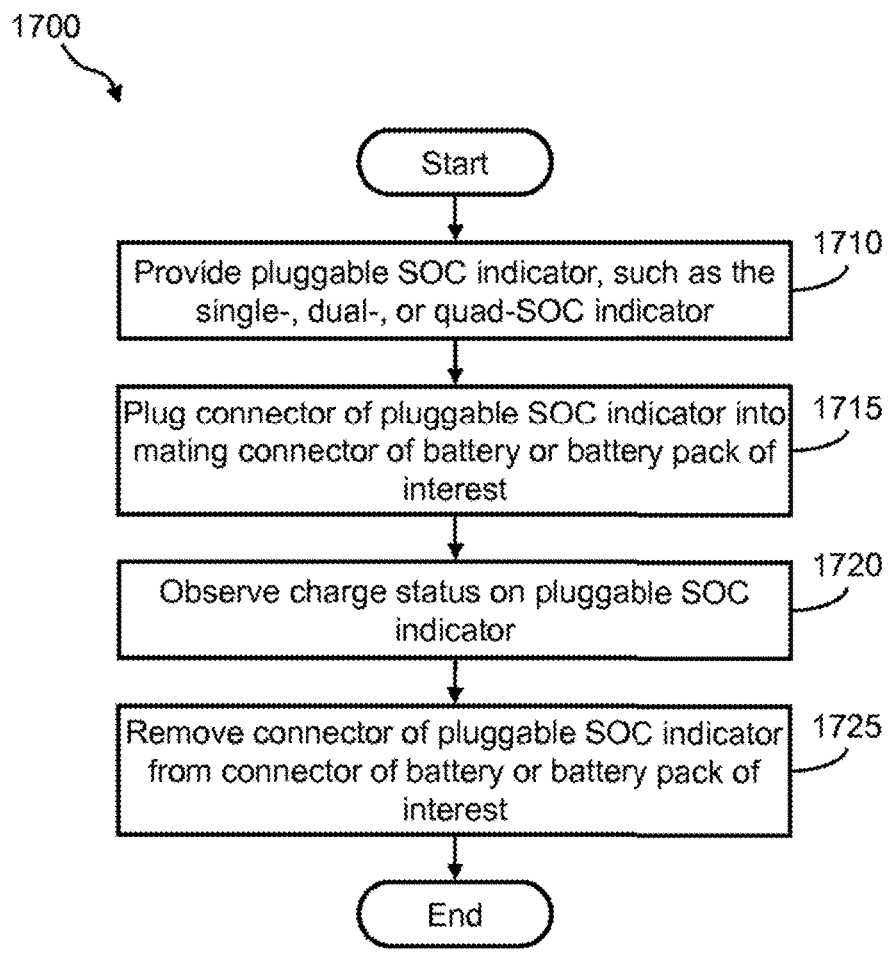
FIG. 17 illustrates a flow diagram of an example of a method of using the pluggable SOC indicator in one configuration.

FIG. 17 illustrates a flow diagram of an example of a method 1700 of using the pluggable SOC indicator according to a simplest configuration. The method 1700 includes, but is not limited to, the following steps.

At a step 1710, a pluggable single, dual, or quad SOC indicator is provided. In one example, the pluggable dual-connector SOC indicator 700 that is described with reference to FIG. 7 through FIG. 16 is provided.

At a step 1715, the voltage input connector of the pluggable SOC indicator is plugged into the mating connector (i.e., a voltage output connector) of the battery or battery pack of interest. For example, a user plugs the voltage input jack 740*a* of the pluggable dual-connector SOC indicator 700 into the voltage output connector of the battery or battery pack of interest, such as the connector 1615 of the battery or battery pack 1610.

At a step 1720, the charge status of the battery or battery pack of interest is observed on the pluggable SOC indicator. For example, the user observes 1, 2, 3, 4, or 5 bars, or any fractions thereof, in the viewing window 732*a* of the pluggable dual-connector SOC indicator 700.

At a step 1725, the connector of pluggable SOC indicator is removed from the connector of battery or battery pack of interest. For example, upon satisfactorily observing the charge status of the battery or battery pack of interest, the user removes the voltage input jack 740*a* of the pluggable dual-connector SOC indicator 700 from the mating connector of the battery or battery pack of interest, such as from the connector 1615 of the battery or battery pack 1610.

Figure 18:
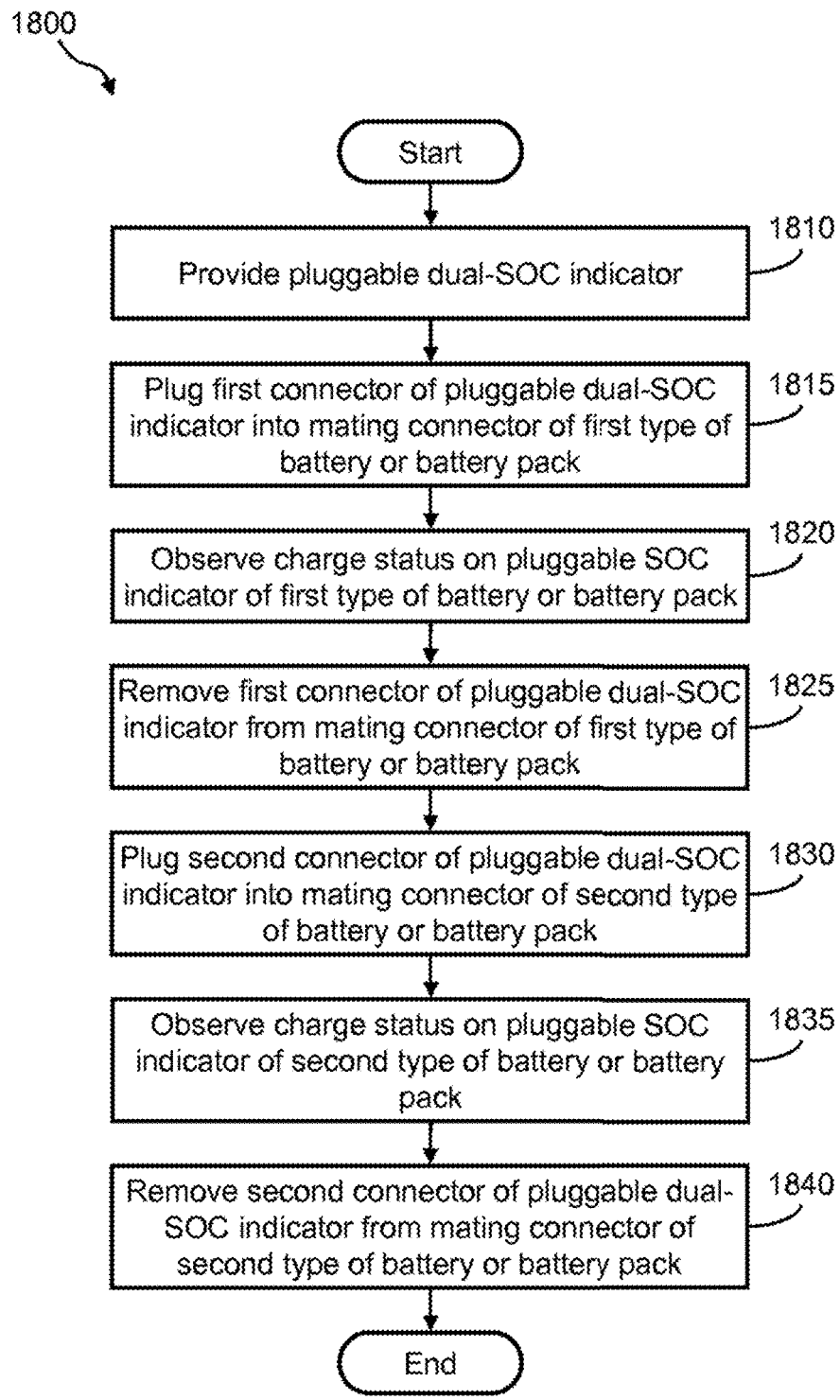
FIG. 18 illustrates a flow diagram of an example of a method of using the pluggable dual-connector SOC indicator shown in FIG. 7.

FIG. 18 illustrates a flow diagram of an example of a method 1800 of using the pluggable dual-connector SOC indicator 700. The method 1800 includes, but is not limited to, the following steps.

At a step 1810, the pluggable dual-connector SOC indicator 700 that is described with reference to FIG. 7 through FIG. 16 is provided.

At a step 1815, the first connector of pluggable dual-connector SOC indicator 700 is plugged into the mating connector of a first type of battery or battery pack. For example, a user plugs the voltage input jack 740*a* of the pluggable dual-connector SOC indicator 700 into the mating connector of a 24-volt battery.

At a step 1820, the charge status of the first type of battery or battery pack of interest is observed on the pluggable dual-connector SOC indicator 700. For example, the user observes 1, 2, 3, 4, or 5 bars, or any fractions thereof, in the viewing window 732*a* of the pluggable dual-connector SOC indicator 700, which is the charge status of the 24-volt battery.

At a step 1825, the first connector of pluggable dual-connector SOC indicator 700 is removed from the connector of the first type of battery or battery pack. For example, upon satisfactorily observing the charge status of the 24-volt battery, the user removes the voltage input jack 740*a* of the pluggable dual-connector SOC indicator 700 from the mating connector of the 24-volt battery.

At a step 1830, the second connector of pluggable dual-connector SOC indicator 700 is plugged into the mating connector of a second type of battery or battery pack. For example, a user plugs the voltage input jack 740*b* of the pluggable dual-connector SOC indicator 700 into the mating connector of a 20-volt battery.

At a step 1835, the charge status of the second type of battery or battery pack of interest is observed on the pluggable dual-connector SOC indicator 700. For example, the user observes 1, 2, 3, 4, or 5 bars, or any fractions thereof, in the viewing window 732*b* of the pluggable dual-connector SOC indicator 700, which is the charge status of the 20-volt battery.

At a step 1840, the second connector of pluggable dual-connector SOC indicator 700 is removed from the connector of the second type of battery or battery pack. For example, upon satisfactorily observing the charge status of the 20-volt battery, the user removes the voltage input jack 740*b* of the pluggable dual-connector SOC indicator 700 from the mating connector of the 20-volt battery.

Additionally, in method 1800, because the two portions of the pluggable dual-connector SOC indicator 700 operate separately and independently, the steps 1815, 1820, and 1825 can be performed at substantially the same time as the steps 1830, 1835, and 1840. Namely, the charge status of both the 24-volt battery and the 20-volt battery can be observed at substantially the same time.

Accordingly, one aspect of the pluggable SOC indicators, such as the pluggable single-connector SOC indicator 100, the pluggable dual-connector SOC indicator 200, the pluggable quad-connector SOC indicator 300, and the pluggable dual-connector SOC indicator 700, is that they are under power only when actively attached to the battery or battery pack to be monitored. Therefore, the pluggable SOC indicators present a load or drain on the battery or battery pack to be monitored only during the brief period of time in which they are plugged in and the user is observing the charge status.

Figure 19:
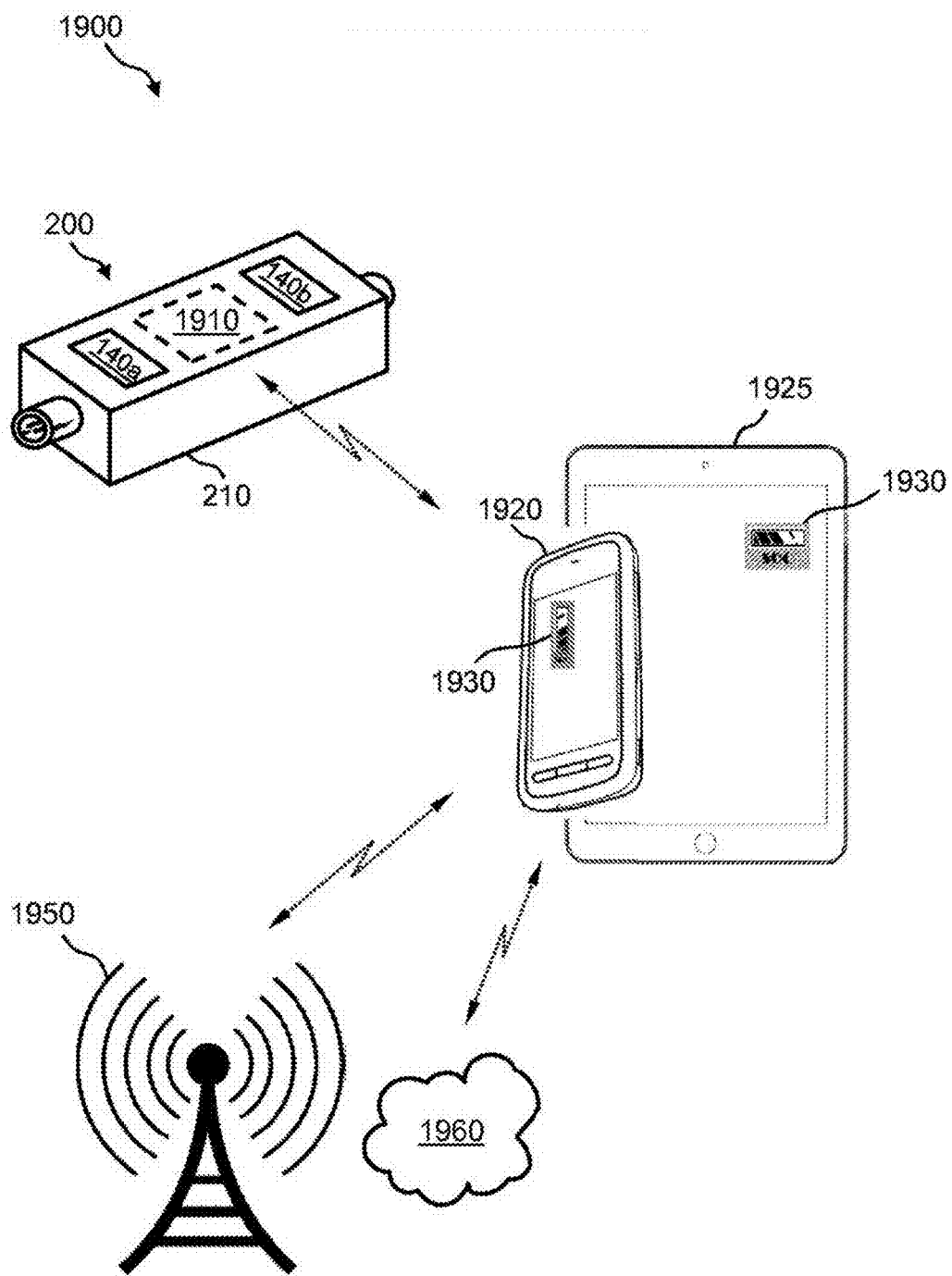
FIG. 19 illustrates a block diagram of an example of an SOC system that includes a mobile application for use with a pluggable SOC indicator.

FIG. 19 illustrates a block diagram of an example of an SOC system 1900 that includes a mobile application for use with the pluggable SOC indicators. The SOC system 1900 includes at least one of any of the pluggable SOC indicators (e.g., pluggable single-connector SOC indicator 100 of FIG. 1, pluggable dual-connector SOC indicator 200 of FIG. 2, or pluggable quad-connector SOC indicator 300 of FIG. 3). For example, FIG. 19 shows the pluggable dual-connector SOC indicator 200, wherein the pluggable dual-connector SOC indicator 200 includes a communications interface 1910.

The communications interface 1910 is any wired and/or wireless communication interface for connecting to a network and by which information may be exchanged with other devices connected to the network. Examples of wired communication interfaces include, but are not limited to, USB ports, RS232 connectors, RJ45 connectors, Ethernet, and any combinations thereof. Examples of wireless communication interfaces include, but are not limited to, an Intranet connection, Internet, ISM, Bluetooth® technology, Wi-Fi, Wi-Max, IEEE 802.11 technology, radio frequency (RF), Infrared Data Association (IrDA) compatible protocols, Local Area Networks (LAN), Wide Area Networks (WAN), Shared Wireless Access Protocol (SWAP), any combinations thereof, and other types of wireless networking protocols.

The communications interface 1910 is used to communicate, preferably wirelessly, with mobile devices, such as but not limited to, a mobile phone 1920 or a tablet device 1925. The mobile phone 1920 can be any mobile phone that (1) is capable of running mobile applications and (2) is capable of communicating with the pluggable SOC indicators. The mobile phone 1920 can be, for example, an Android™ phone, an Apple iPhone, or a Samsung Galaxy phone. Likewise, the tablet device 1925 can be any tablet device that (1) is capable of running mobile applications, (2) is capable of communicating with the pluggable SOC indicators, and (3) has cellular network capability. The tablet device 1925 can be, for example, the 3G or 4G version of the Apple iPad.

Further, in SOC system 1900, the mobile phone 1920 and/or the tablet device 1925 is in communication with a cellular network 1950 and/or a network 1960. The network 1960 can be any network for providing wired or wireless connection to the Internet, such as a local area network (LAN) or a wide area network (WAN).

An SOC mobile application 1930 is installed and running at the mobile phone 1920 and/or the tablet device 1925. The SOC mobile application 1930 is implemented according to the type (i.e., the operating system) of mobile phone 1920 and/or tablet device 1925 on which it is running. The SOC mobile application 1930 is designed to receive SOC information from the pluggable SOC indicators (e.g., pluggable single-connector SOC indicator 100 of FIG. 1, pluggable dual-connector SOC indicator 200 of FIG. 2, or pluggable quad-connector SOC indicator 300 of FIG. 3). The SOC mobile application 1930 indicates graphically, audibly, and/or tactilely, the state of charge to the user (not shown).

Figure 20:
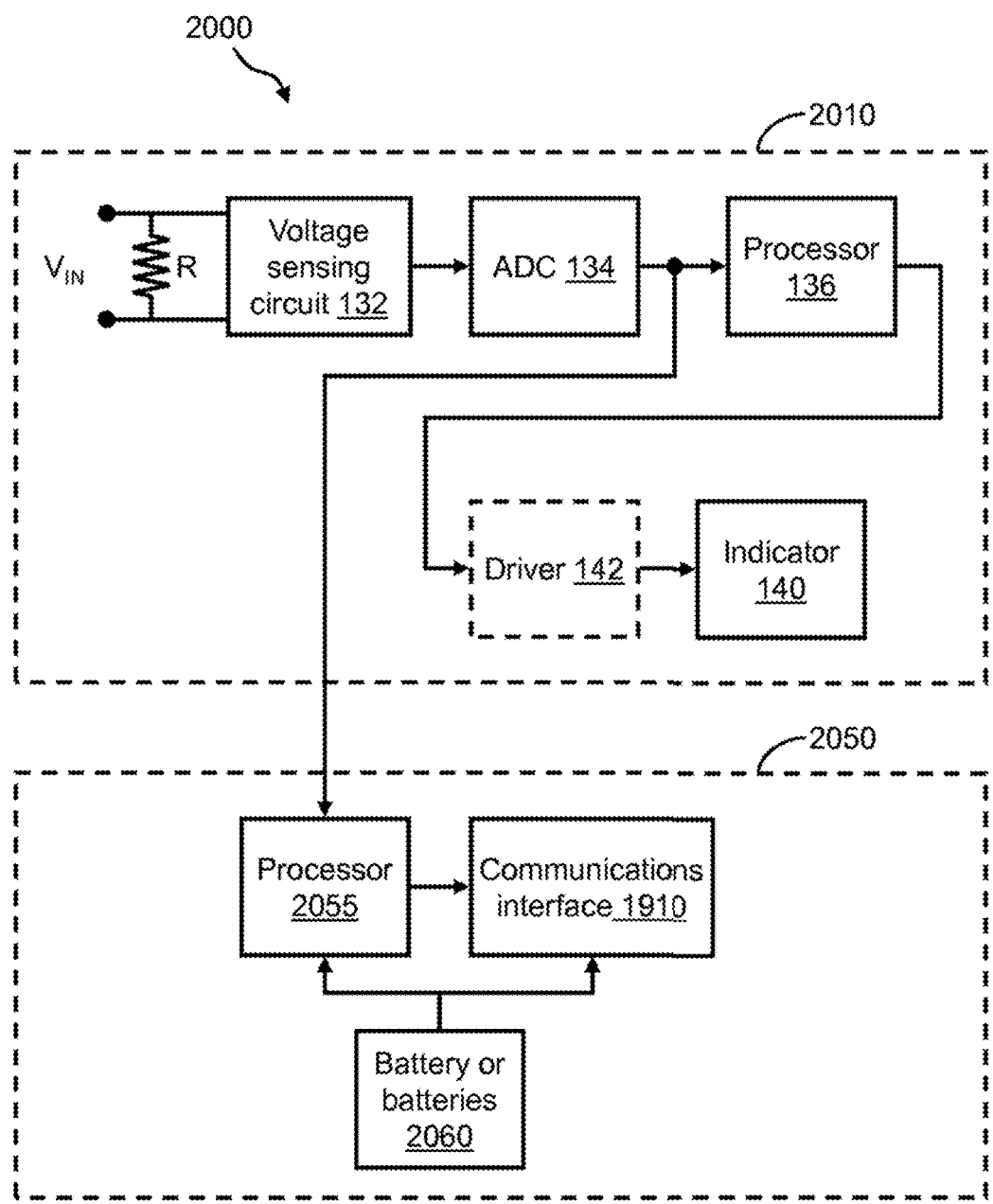
FIG. 20 illustrates a block diagram of an example of the control electronics of a pluggable SOC indicator that is capable of communicating with a mobile application.

FIG. 20 illustrates a block diagram of an example of control electronics 2000 of the pluggable SOC indicators that is capable of communicating with the SOC mobile application 1930. In this example, the control electronics 2000 includes an SOC portion 2010 and a communications portion 2050. The SOC portion 2010 is substantially the same as the control electronics 130 shown in FIG. 4. The communications portion 2050 handles the communication of the SOC information to the SOC mobile application 1930 at, for example, the mobile phone 1920 and/or the tablet device 1925.

The communications portion 2050 includes a processor 2055 that is communicatively connected to the communications interface 1910. The digital output of the ADC 134 of the SOC portion 2010, which is the SOC information, feeds an input to the processor 2055. The processor 2055 can be any controller, microcontroller, or microprocessor that is capable of processing program instructions. One or more batteries 2060 provide power to the processor 2055 and the communications interface 1910. The one or more batteries 2060 can be any standard cylindrical battery, such as quadruple-A, triple-A, or double-A, or a battery from the family of button cell and coin cell batteries. A specific example of a battery 2060 is the CR2032 coin cell 3-volt battery.

In control electronics 2000, the SOC portion 2010 and the communications portion 2050 operate substantially independent of one another. Namely, the communications portion 2050 is powered separately from the SOC portion 2010 so that the communications portion 2050 is not dependent on the presence of the input voltage VIN at the SOC portion 2010 for power. Therefore, in this example, the communications portion 2050 is operable to transmit information to the SOC mobile application 1930 at any time, even when not plugged into, for example, the battery or battery pack 1610. However, in order to conserve battery life, in one embodiment the processor 2055 is programmed to be in sleep mode when no voltage is detected at the input voltage VIN at the SOC portion 2010 and to wake up when an input voltage VIN is detected. Alternatively, the SOC mobile application 1930 is programmed to pull SOC information from control electronics 2000 periodically, such as every hour, regardless of the state of input voltage VIN.

Figure 21:
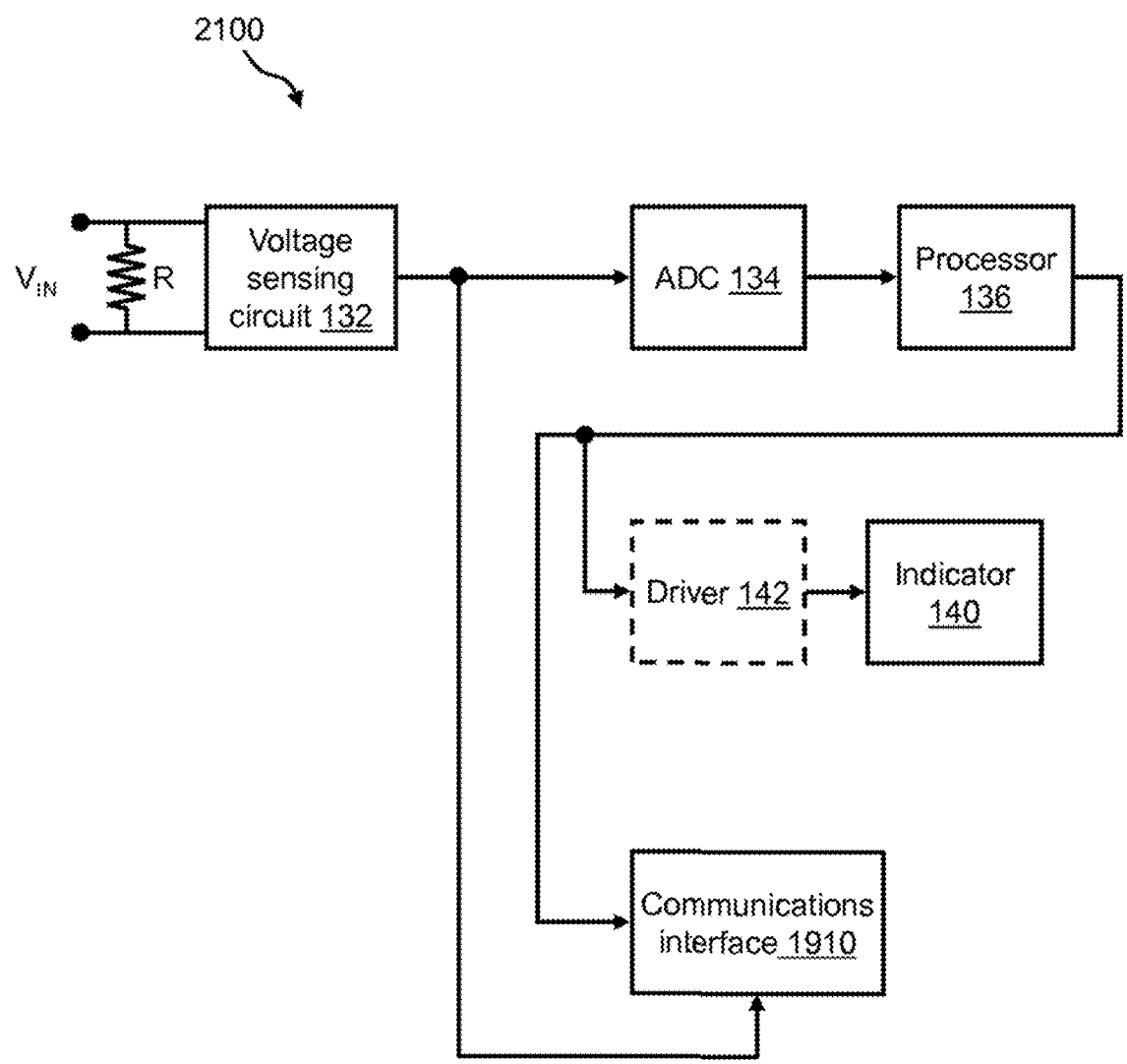
FIG. 21 illustrates a block diagram of another example of the control electronics of a pluggable SOC indicator that is capable of communicating with a mobile application.

FIG. 21 illustrates a block diagram of another example of control electronics 2100 of the pluggable SOC indicators that is capable of communicating with the SOC mobile application 1930. In this example, the operation of the communications interface 1910 is dependent on the presence of a voltage at input voltage VIN. For example, the operation of communications interface 1910 is dependent on the pluggable SOC indicators being plugged into, for example, the battery or battery pack 1610. This is because, in control electronics 2100, the communications interface 1910 is powered from the output of voltage sensing circuit 132. Further, the processor 136 provides the input (i.e., the SOC information) to the communications interface 1910. A drawback of the control electronics 2100 of FIG. 21 as compared with the control electronics 2000 of FIG. 20, is that it is operable to transmit SOC information to the SOC mobile application 1930 only when in use, i.e., only when plugged into, for example, the battery or battery pack 1610.

Following long-standing patent law convention, the terms "a," "an," and "the" refer to "one or more" when used in this application, including the claims. Thus, for example, reference to "a subject" includes a plurality of subjects, unless the context clearly is to the contrary (e.g., a plurality of subjects), and so forth.

Throughout this specification and the claims, the terms "comprise," "comprises," and "comprising" are used in a non-exclusive sense, except where the context requires otherwise. Likewise, the term "include" and its grammatical variants are intended to be non-limiting, such that recitation of items in a list is not to the exclusion of other like items that can be substituted or added to the listed items.

For the purposes of this specification and appended claims, unless otherwise indicated, all numbers expressing amounts, sizes, dimensions, proportions, shapes, formulations, parameters, percentages, parameters, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the present invention. For example, the term "about," when referring to a value can be meant to encompass variations of, in some embodiments, ±100% in some embodiments ±50%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

Further, the term "about" when used in connection with one or more numbers or numerical ranges, should be understood to refer to all such numbers, including all numbers in a range and modifies that range by extending the boundaries above and below the numerical values set forth. The recitation of numerical ranges by endpoints includes all numbers, e.g., whole integers, including fractions thereof, subsumed within that range (for example, the recitation of 1 to 5 includes 1, 2, 3, 4, and 5, as well as fractions thereof, e.g., 1.5, 2.25, 3.75, 4.1, and the like) and any range within that range.

The above-mentioned examples are provided to serve the purpose of clarifying the aspects of the invention, and it will be apparent to one skilled in the art that they do not serve to limit the scope of the invention. By way of example, the connectors may be non-circular. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. An indicator device for monitoring a state of charge of one or more batteries or battery packs, the device comprising:

at least one voltage input connector configured to be electrically coupled to at least one mating voltage output connector of a battery or battery pack, wherein the at least one voltage input connector comprises a slip-on, non-locking male circular connector including a circular cross-section, wherein the at least one mating voltage output connector comprises a slip-on, non-locking female circular connector including a circular cross-section, and wherein the at least one voltage input connector is configured to press fit onto the at least one mating voltage output connector of the battery or battery pack such that the circular cross-section of the non-locking circular male connector fits within the circular cross-section of the non-locking female circular connector;

control electronics capable of measuring a voltage received from the at least one voltage input connector when the at least one voltage input connector is electrically coupled to the at least one mating voltage output connector of the battery or battery pack to be monitored, and wherein the control electronics are configured to process an input voltage range and/or a battery discharge characteristic to determine a state of charge, wherein the control electronics include a voltage sensing circuit, an analog-to-digital converter (ADC), a processor, and a driver to drive the at least one indicator;

a housing adapted to house the at least one voltage input connector, the control electronics, and the at least one indicator; and at least one indicator which indicates the state of charge;

wherein the at least one voltage input connector, the control electronics, and the at least one indicator are in electronic communication;

wherein the state of charge indicated by the at least one indicator is related to the voltage measured by the control electronics; and wherein the housing comprises a base plate and a plastic cover comprising a clouded plastic and including at least one viewing window comprised of a clear plastic, wherein the state of charge is operable to be viewed through one or more of the at least one viewing window.

2. The device of claim 1, wherein the at least one indicator is a visual indicator, an audible indicator, and/or a tactile indicator.

3. The device of claim 2, wherein the visual indicator is at least one liquid crystal display (LCD) and/or at least one light-emitting diode (LED).

4. The device of claim 1, further comprising between one and four voltage input connectors, wherein the between one and four voltage input connectors are each in electronic communication with between one and four corresponding sets of control electronics and between one and four corresponding indicators, wherein each separate indicator in electronic communication with its voltage input connector operates independently.

5. The device of claim 1, wherein the voltage sensing circuit comprises one or more amplification or de-amplification functions for generating an analog voltage that correlates to an amplitude of the input voltage.

6. The device of claim 1, wherein the processor comprises internal programmable functions for:

programming an expected range of an input voltage $V_{IN}$; and correlating a value of the input voltage $V_{IN}$ to the state of charge indicated by the at least one indicator.

7. An indicator device for monitoring a state of charge of one or more batteries or battery packs, the device comprising:
- at least one voltage input connector configured to be intermittently electrically coupled to and decoupled from at least one mating voltage output connector of a battery or battery pack, wherein the at least one voltage input connector comprises a slip-on, non-locking male circular connector including a circular cross-section, wherein the at least one mating voltage output connector comprises a slip-on, non-locking female circular connector including a circular cross-section, and wherein the at least one voltage input connector is configured to press fit onto the at least one mating voltage output connector of the battery or battery pack such that the circular cross-section of the non-locking circular male connector fits within the circular cross-section of the non-locking female circular connector;
- control electronics capable of measuring a voltage received from the at least one voltage input connector when the at least one voltage input connector is electrically coupled to the at least one mating voltage output connector of the battery or battery pack to be monitored, wherein the control electronics are configured to process an input voltage range and/or a battery discharge characteristic to determine a state of charge, and wherein the control electronics include a voltage sensing circuit, an analog-to-digital converter (ADC), a processor, and a driver;
- at least one indicator which indicates the state of charge; and
- a housing adapted to house the at least one voltage input connector, the control electronics, and the at least one indicator;
- wherein the driver drives the at least one indicator;
- wherein the at least one voltage input connector, the control electronics, and the at least one indicator are in electronic communication;
- wherein the state of charge indicated by the at least one indicator is related to the voltage measured by the control electronics;
- wherein the housing comprises a base plate and a plastic cover comprising a clouded plastic and including at least one viewing window comprised of a clear plastic, wherein the state of charge is operable to be viewed through one or more of the at least one viewing window; and
- wherein the plastic cover has a curvature to mate with a base plate and at least one end plate.

8. A device for monitoring and communicating a state of charge of one or more batteries or battery packs, the device comprising:
- at least one voltage input connector configured to be electrically coupled to at least one mating voltage output connector of a battery or battery pack, wherein the at least one voltage input connector comprises a slip-on, non-locking male circular connector including a circular cross-section, wherein the at least one mating voltage output connector comprises a slip-on, non-locking female circular connector including a circular cross-section, and wherein the at least one voltage input connector is configured to press fit onto the at least one mating voltage output connector of the battery or battery pack such that the circular cross-section of the non-locking circular male connector fits within the circular cross-section of the non-locking female circular connector;
- control electronics capable of measuring a voltage received from the at least one voltage input connector when the at least one voltage input connector is electrically coupled to the at least one mating voltage output connector of the battery or battery pack to be monitored, wherein the control electronics are configured to process an input voltage range and/or a battery discharge characteristic to determine a state of charge, wherein the control electronics include a voltage sensing circuit, an analog-to-digital converter (ADC), and a processor, and wherein the state of charge is related to the voltage measured by the control electronics;
- a housing adapted to house the at least one voltage input connector, the control electronics, and the at least one indicator; and
- a communications interface configured to communicate information related to the state of charge to a network;
- wherein the housing comprises a base plate and a plastic cover comprising a clouded plastic and including at least one viewing window comprised of a clear plastic, wherein the state of charge is operable to be viewed through one or more of the at least one viewing window.

9. The device of claim 8, wherein the communications interface is configured to wirelessly communicate with a mobile phone or a tablet coupled to the network.

10. The device of claim 8, wherein the communications interface is powered by the battery or battery pack to be monitored.

11. The device of claim 8, wherein the communications interface further comprises a processor, wherein the processor is programmed to wake up when an input voltage $V_{IN}$ is detected and to be in sleep mode when no voltage is detected at the input voltage $V_{IN}$.

12. The device of claim 1, wherein the device weighs less than 226.8 g (8 ounces).

13. The device of claim 1, wherein the device has a width of 3.8 cm (1.5 inches), a height of 3 cm (1.2 inches), and a length of 10.2 cm (4 inches).

14. The device of claim 1, wherein the at least one voltage input connector includes a first voltage input connector and a second voltage input connector, wherein the first voltage input connector has a first input voltage and the second voltage input connector has a second input voltage, wherein the first input voltage is higher than the second input voltage, and wherein the first voltage input connector has a larger diameter than the second voltage input connector.

15. The device of claim 1, wherein the base plate is an aluminum base plate, wherein the plastic cover includes side rails, and wherein the side rails fit atop edges of the aluminum base plate.

16. The device of claim 15, wherein the aluminum base plate includes at least one aluminum end plate, wherein the at least one voltage input connector is panel mounted to a corresponding aluminum end plate, and wherein the plastic cover has a curvature to mate with the aluminum base plate and the at least one aluminum end plate.

17. The device of claim 7, wherein the at least one voltage input connector includes a first voltage input connector and a second voltage input connector, wherein the first voltage input connector has a first input voltage and the second voltage input connector has a second input voltage, wherein the first input voltage is higher than the second input voltage, and wherein the first voltage input connector has a larger diameter than the second voltage input connector.

18. The device of claim 8, wherein the at least one voltage input connector includes a first voltage input connector and a second voltage input connector, wherein the first voltage input connector has a first input voltage and the second voltage input connector has a second input voltage, wherein the first input voltage is higher than the second input voltage, and wherein the first voltage input connector has a larger diameter than the second voltage input connector.

19. The device of claim 8, wherein the base plate is an aluminum base plate, wherein the plastic cover includes side rails, and wherein the side rails fit atop edges of the aluminum base plate.

20. The device of claim 19, wherein the aluminum base plate includes at least one aluminum end plate, wherein the at least one voltage input connector is panel mounted to a corresponding aluminum end plate, and wherein the plastic cover has a curvature to mate with the aluminum base plate and the at least one aluminum end plate.

* * * * *